(12) United States Patent
Shkel et al.

(10) Patent No.: US 11,703,330 B2
(45) Date of Patent: Jul. 18, 2023

(54) FUSED QUARTZ DUAL SHELL RESONATOR AND METHOD OF FABRICATION

(71) Applicant: The Regents of the University of California, Oakland, CA (US)

(72) Inventors: Andrei M. Shkel, Irvine, CA (US); Mohammad H. Asadian Ardakani, Irvine, CA (US); Yusheng Wang, Irvine, CA (US)

(73) Assignee: The Regents of the University of California, Oakland, CA (US)

( * ) Notice: Subject to any disclaimer, the term of this patent is extended or adjusted under 35 U.S.C. 154(b) by 558 days.

(21) Appl. No.: 16/836,387

(22) Filed: Mar. 31, 2020

(65) Prior Publication Data

US 2020/0309527 A1   Oct. 1, 2020

Related U.S. Application Data

(60) Provisional application No. 62/908,459, filed on Sep. 30, 2019, provisional application No. 62/827,762, filed on Apr. 1, 2019.

(51) Int. Cl.
*G01C 19/5719*   (2012.01)
*B81C 1/00*   (2006.01)
(Continued)

(52) U.S. Cl.
CPC ...... *G01C 19/5719* (2013.01); *B81C 1/00182* (2013.01); *H03H 3/0072* (2013.01);
(Continued)

(58) Field of Classification Search
CPC ............ G01C 19/5719; G01C 19/5691; B81C 1/00182; B81C 1/00158; H03H 3/0072;
(Continued)

(56) References Cited

U.S. PATENT DOCUMENTS

| 8,765,615 B1 * | 7/2014 | Chang ................. B81C 1/00238 |
| | | 438/700 |
| 9,429,428 B2 | 8/2016 | Shkel et al. |

(Continued)

*Primary Examiner* — Alexander A Mercado
*Assistant Examiner* — John M Royston
(74) *Attorney, Agent, or Firm* — John P. Teresinski; Stites & Harbison PLLC

(57) ABSTRACT

A dual-shell architecture and methods of fabrication of fused quartz resonators is disclosed. The architecture may include two encapsulated and concentric cavities using plasma-activated wafer bonding followed by the high-temperature glassblowing. The dual-shell architecture can provide a protective shield as well as a "fixed-fixed" anchor for the sensing element of the resonators. Structures can be instrumented to operate as a resonator, a gyroscope, or other vibratory sensor and for precision operation in a harsh environment. Methods for fabricating a dual-shell resonator structure can include pre-etching cavities on a cap wafer, pre-etching cavities on a device wafer, bonding the device wafer to a substrate wafer to form a substrate pair and aligning and bonding the cap wafer to the substrate pair to form a wafer stack with aligned cavities including a cap cavity and a device cavity. The wafer stack may be glass-blown to form a dual-shell structure.

20 Claims, 29 Drawing Sheets

(51) Int. Cl.
    *H03H 3/007*     (2006.01)
    *H03H 9/10*     (2006.01)
    *B81B 3/00*     (2006.01)
    *G01C 19/5691*     (2012.01)
    *B81B 7/00*     (2006.01)

(52) U.S. Cl.
    CPC ......... *H03H 9/1057* (2013.01); *B81B 3/0051* (2013.01); *B81B 7/0016* (2013.01); *B81B 2201/0242* (2013.01); *B81B 2201/0271* (2013.01); *B81B 2203/0127* (2013.01); *B81B 2203/0172* (2013.01); *B81C 1/00158* (2013.01); *G01C 19/5691* (2013.01)

(58) Field of Classification Search
    CPC ............... H03H 9/1057; B81B 3/0051; B81B 2203/0172; B81B 2201/0242; B81B 2201/0271; B81B 2203/0127; B81B 7/0016

See application file for complete search history.

(56) References Cited

U.S. PATENT DOCUMENTS

| | | | |
|---|---|---|---|
| 10,266,398 B1* | 4/2019 | Kubena | C23C 16/403 |
| 2004/0226377 A1* | 11/2004 | Tsugai | G01C 19/5719 |
| | | | 73/514.32 |
| 2012/0024058 A1* | 2/2012 | Zolfagharkhani | G01C 19/56 |
| | | | 73/504.12 |
| 2014/0028410 A1* | 1/2014 | Pedersen | H03H 9/2468 |
| | | | 331/154 |
| 2017/0016742 A1* | 1/2017 | Shkel | G01C 25/00 |
| 2017/0248422 A1* | 8/2017 | Najafi | G01C 25/00 |
| 2018/0188030 A1* | 7/2018 | Shang | B81C 1/00269 |

* cited by examiner

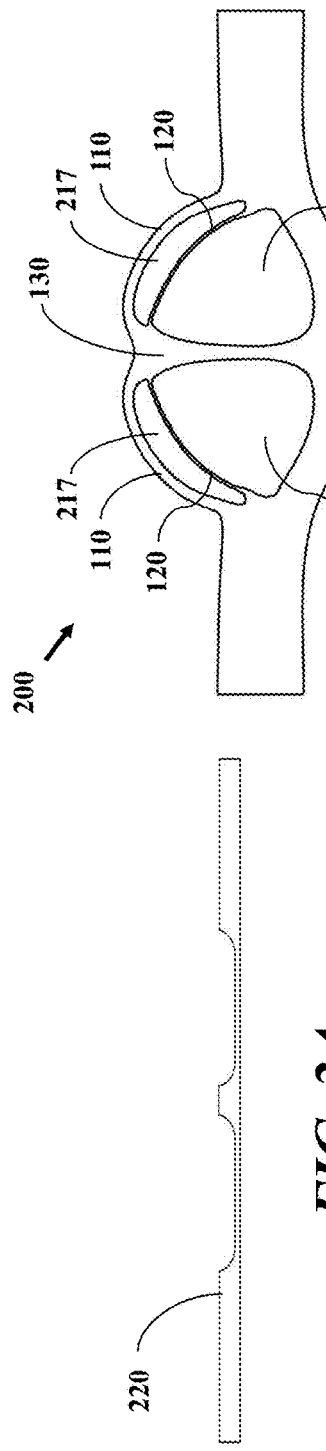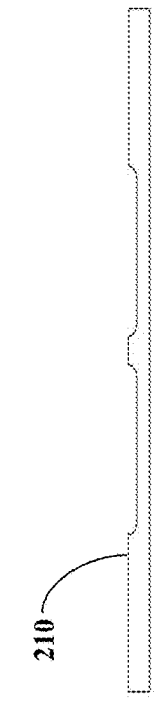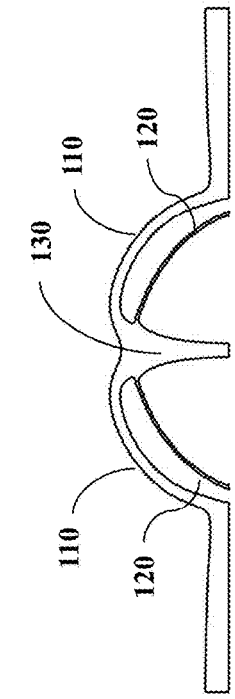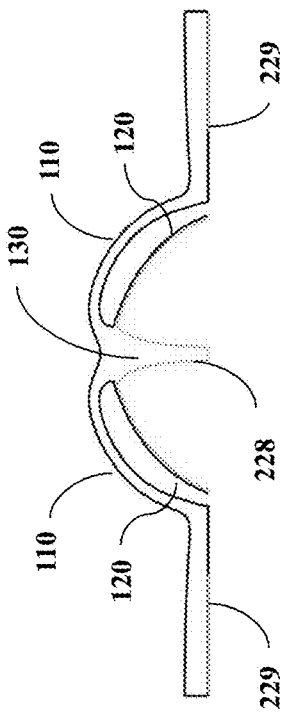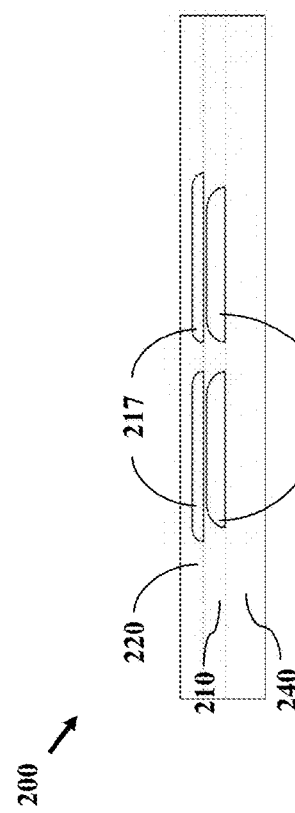

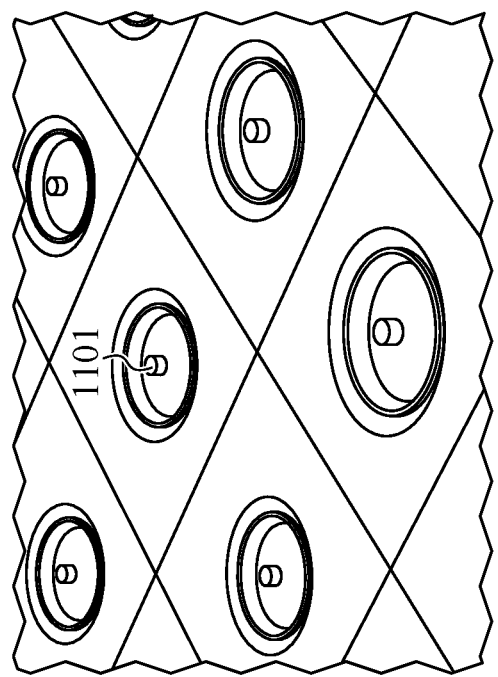
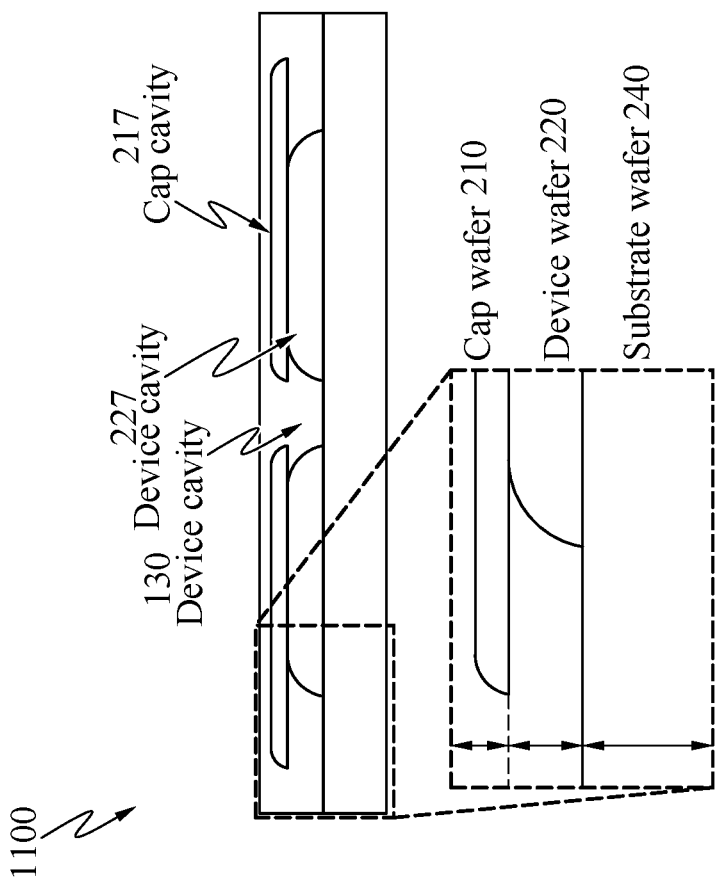

FUSED QUARTZ DUAL SHELL RESONATOR AND METHOD OF FABRICATION

CROSS-REFERENCE TO RELATED APPLICATIONS

This application claims priority to U.S. Provisional Application No. 62/827,762 titled FUSED QUARTZ DUAL SHELL RESONATOR AND METHOD OF FABRICATION filed on Apr. 1, 2019 and U.S. Provisional Application No. 62/908,459 titled FUSED QUARTZ DUAL SHELL RESONATOR AND METHOD OF FABRICATION filed on Sep. 30, 2019, the content of which is expressly incorporated by reference in its entirety.

STATEMENT OF GOVERNMENT SUPPORT

This invention was made with Government support under Grant No. N66001-16-1-4021 awarded by Defense Advanced Research Projects Agency (DARPA). The Government has certain rights in the invention.

FIELD

The present disclosure generally relates to dual-shell resonator structures and methods of manufacturing.

BACKGROUND

Implementation of Micro-Electro-Mechanical Systems (MEMS) gyroscopes in high-performance applications requires maintaining sensor integrity and survivability during high-spin and shock events. With conventional resonators, mechanical stresses induced in harsh dynamic environments can result in microcracks in high-stress concentration locations and fracture of sensor structural material. The displacement induced by the external shocks and vibrations during the operation of an electrostatically driven MEMS gyroscope could reduce the threshold of the dynamic pull-in stability and could result in snap-down of the resonant structure. Certain existing configurations with limited bonding surfaces may have weak points.

Conventional structures exist for gyroscope protection including U.S. Pat. No. 9,429,428 to Skel et al. is directed to an Environmentally Robust Micro-Wineglass Gyroscope.

There exists a need for improved structures and fabrication processes for resonator structures.

BRIEF SUMMARY OF THE EMBODIMENTS

Disclosed and claimed herein are dual-shell structures, resonators and methods of fabrication.

One embodiment is directed to a dual-shell resonator including an outer cap shell having an outer rim, and an inner device shell, wherein the outer cap shell and inner device shell are co-fabricated and share a common stem. The outer rim of the cap shell and a base of the inner stem are each configured to be fixed to a substrate layer and to provide an anchor for the inner device shell. The inner device shell includes a portion configured to vibrate within the outer cap shell. The outer cap shell, inner device shell and common stem are formed by triple stacked wafers with concentric cavities.

In one embodiment, the outer cap shell is a hemispherical dome configured to house the inner device shell, and wherein the outer cap shell, inner device shell and stem are fused quartz.

In one embodiment, the inner device shell is configured to operate using at least one of capacitive excitation and detection relative to the substrate layer.

In one embodiment, the outer cap shell, the inner device shell and stem are co-fabricated by high-temperature glass-blowing of the triple-stacked wafers, and wherein the common stem is a self-aligned stem.

In one embodiment, a sensor is configured to measure vibrations of the inner device shell.

In one embodiment, the outer cap layer includes a deposited piezo layer.

In one embodiment, the outer cap layer includes at least one electrode configuration deposited by shadow mask.

In one embodiment, the outer cap layer includes a differential driving configuration including at least a first set of electrode areas deposited on a first area and a second set of electrode areas deposited on a second area.

In one embodiment, a first set of electrodes are deposited on a dome portion of the outer cap shell associated with the first area and the second set of electrodes are deposited in a recess of the cap shell associated with the second area, the first area perpendicular to the second area.

In one embodiment, the dual shell resonator is configured to include a connection of the outer rim of the outer cap shell to a substrate, and a plurality of electrode connections coupled to electrode areas deposited on the outer cap shell.

According to one embodiment, a method for fabricating a dual-shell resonator structure is provided. The method includes pre-etching cavities on a cap wafer, pre-etching cavities on a device wafer, bonding the device wafer to a substrate wafer to form a substrate pair, and aligning and bonding the cap wafer to the substrate pair to form a wafer stack with aligned cavities including a cap cavity and a device cavity. The method also includes performing glass-blowing of the wafer stack to form a dual-shell structure. The dual shell structure includes an outer cap shell having an outer rim, and an inner device shell, wherein the outer cap shell and inner device shell are co-fabricated and share a common stem. The outer rim of the cap shell and a base of the inner stem are each configured to be fixed to a substrate layer and to provide an anchor for the inner device shell. The inner device shell includes a portion configured to vibrate within the outer cap shell.

In one embodiment, pre-etching cavities on the device wafer and cap wafer includes pre-etching fused quartz wafers by isotropic wet etching using Hydrofluoric (HF) acid.

In one embodiment, the device wafer is bonded to the substrate wafer and the cap wafer is aligned and bonded to the substrate pair by plasma-assisted wafer bonding.

In one embodiment, the outer cap shell is a hemispherical dome configured to house the inner device shell, and wherein the outer cap shell, inner device shell and stem are fused quartz.

In one embodiment, the method also includes coating an outer surface of the outer shell with a piezo material layer.

In one embodiment, the method also includes applying a thin-film metal conductive coating to an inner surface of the inner device shell and common stem.

In one embodiment, the method also includes applying a thin-film metal bonding coating to a section of the outer cap shell rim.

In one embodiment, the method also includes depositing a differential driving configuration on the outer cap layer, the differential driving configuration including at least a first set of electrode areas deposited on a first area and a second set of electrode areas deposited on a second area.

In one embodiment, the method also includes releasing an inner shell by removing the substrate layer for integration of dual-shell resonator with a flat substrate for electrostatic actuation and detection.

In one embodiment, the method also includes boding the outer cap shell and common stem to a flat substrate by at least one of eutectic bonding, metal-metal compression bonding, and a low-outgassing conductive adhesives bonding, wherein a capacitive gap is provided between the inner device shell and the flat substrate.

Other aspects, features, and techniques will be apparent to one skilled in the relevant art in view of the following detailed description of the embodiments.

BRIEF DESCRIPTION OF THE DRAWINGS

The features, objects, and advantages of the present disclosure will become more apparent from the detailed description set forth below when taken in conjunction with the drawings in which like reference characters identify correspondingly throughout and wherein:

FIGS. 2A-2F show a graphical representation of a dual-shell structure fabrication according to one or more embodiments;

FIG. 11A illustrates a sectional view of a double-cavity triple stack according to one or more embodiments;

FIG. 11B is a perspective view of a bonded wafer stack according to one or more embodiments;

FIG. 16F illustrates a cutaway representation of a dual-shell resonator wafer according to one or more embodiments;

DETAILED DESCRIPTION OF THE EXEMPLARY EMBODIMENTS

Overview and Terminology

Figure 1:
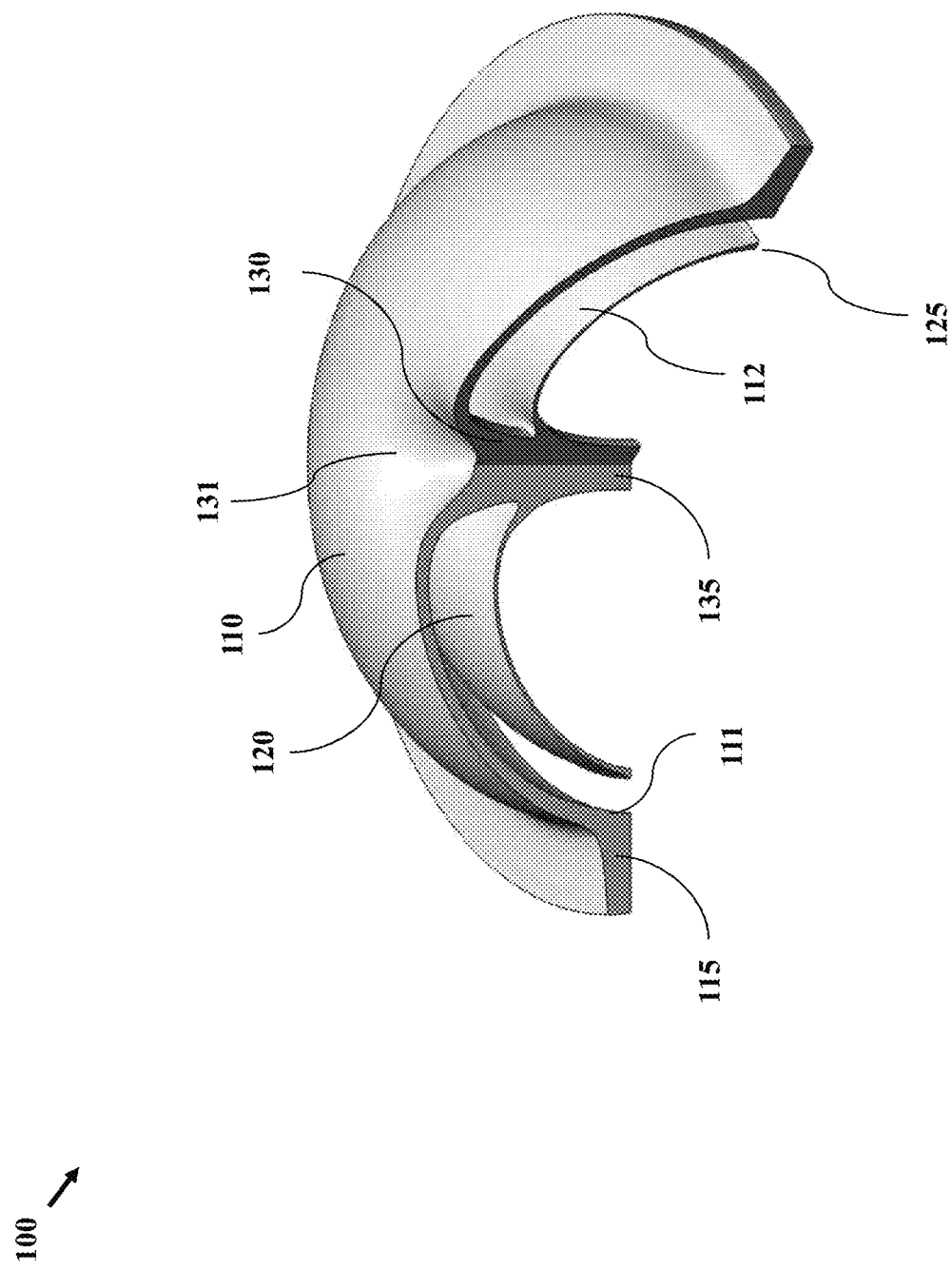
FIG. 1 illustrates a perspective view of a dual-shell structure according to one or more embodiments.

One aspect of the disclosure is directed to dual-shell resonator and resonator structures. Dual-shell structures are provided having an outer cap shell, inner device shell that are co-fabricates and share a common stem. The dual-shell structure may be configured to provide multiple connection points to a substrate. Another aspect of the disclosure is directed to processes and methods of fabricating dual-shell resonators.

According to one embodiment, a dual-shell resonator is configured to provide an architecture for a shell resonator gyroscope using a batch fabrication process. One or more embodiments are directed to an architecture and fabrication process based on wet-etching of cavities to device and cap wafers and bonding the two wafers by plasma bonding. The wet-etched features may be used for alignment of the wafers for plasma bonding. Embodiments described herein can be fabricated without requiring wafer bonding in a vacuum, and this reduce the complexity of manufacturing. In addition, structures and processes described herein parameters may be provided to minimize the displacement of a resonator when subjected to external high-g-shock and vibration. A dual-shell architecture as described herein can enable gyroscope operation through shock and vibration. In addition, the architecture can provide a co-fabricated cap shell to shield the gyroscope from environmental radiation, thermal fluctuation, airborne particles and as well as enabling in-situ vacuum sealing for an inner sensing element.

According to one embodiment, dual-shell architecture processes are provided for fabrication of a three-dimensional fused quartz resonator. Fabrication can include defining two encapsulated concentric cavities using plasma-activated wafer bonding followed by high temperature glassblowing. The fabrication process can include use of triple wafer alignment and bonding using plasma bonding. Simulation results are provided herein. Structures described herein can be utilized as one or more of a resonator, gyroscope, and vibratory sensor in general.

Another aspect of the disclosure relates to Micro-Electro-Mechanical Systems (MEMS) sensors, and more particularly to hemispherical resonator gyroscopes and for operation of the gyroscopes in a harsh environment. Configurations are provided to allow for 3D shell structures to be instrumented as the sensing element. According to one embodiment, fused quartz (FQ) shell resonators are provided for gyroscopes and fabricated by thermoplastic bulk deformation of FQ material at high temperatures using micro glassblowing or blow-torch molding. For gyroscope operation, the three-dimensional FQ shell resonators were assembled on a substrate for capacitive actuation and detection. In alternate embodiments, fused silica gyroscopes may be produced by using fused silica instead of fused quartz.

According to one or more other embodiments, structures and fabrication processes are provided for piezo actuation of fused quartz dual shell resonators. Actuation of a resonator may include converting a signal (in most cases electric signal) into the motion of the resonator. For resonators made of electrically conductive material, such as silicon, the resonator structure itself can be used as an electric path for the signal. For resonators made of insulator, such as fused quartz, a metal coating may be necessary. Embodiments are directed to depositing and forming electrical paths and connections for one or more of delivering and receiving electric signals relative to the structure. Fused quartz may be characterized as having a very low intrinsic internal energy loss. Therefore, resonators made of fused quartz may provide a high mechanical quality factor compared to traditional silicon resonators. The noise level of a resonator may be inversely proportional to its mechanical quality factor. Therefore, a higher mechanical quality factor can lead to a lower noise level of a resonator, which is the goal of many applications. Embodiments are directed to fabrication processes for dual-shell structures and MEMS resonators.

According to another embodiment, a structure and configurations are provided for a fused quartz dual-shell resonator that includes an inner shell as the resonant element, and the outer shell as the support and protection. According to another embodiment, piezo material deposited and shaped on the outer shell is utilized. As such, vibration of the outer shell can be transferred to the inner shell to actuate the resonant element. In certain embodiments, only the support of the resonator is coated with metal and piezo material, and the resonant part is kept intact. Therefore, the mechanical quality factor of the resonator due to actuation will not be reduced.

According to one embodiment, a base electrode and a piezo material layer may be deposited on the outer cap layer, and the top electrode may be patterned and selectively deposited by shadow mask to actuate the device.

As used herein, the terms "a" or "an" shall mean one or more than one. The term "plurality" shall mean two or more than two. The term "another" is defined as a second or more. The terms "including" and/or "having" are open ended (e.g., comprising). The term "or" as used herein is to be interpreted as inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

Reference throughout this document to "one embodiment," "certain embodiments," "an embodiment," or similar term means that a particular feature, structure, or characteristic described in connection with the embodiment is included in at least one embodiment. Thus, the appearances of such phrases in various places throughout this specification are not necessarily all referring to the same embodiment. Furthermore, the particular features, structures, or characteristics may be combined in any suitable manner on one or more embodiments without limitation.

EXEMPLARY EMBODIMENTS

FIG. 1 illustrates a perspective view of a dual-shell structure according to one or more embodiments. According to one embodiment, a dual-shell structure 100 is a resonator structure that may be employed for one or more sensing applications. A cutaway perspective view of dual-shell structure 100 is shown in FIG. 1. As will be described herein, dual-shell structure 100 is as a three-dimensional (3D) dual-shell structure that can be co-fabricated. In addition, dual-shell structure 100 may be formed by one or more glassblowing operations.

According to one embodiment, dual-shell structure 100 includes an outer cap shell 110 and an inner device shell 120. According to another embodiment, outer cap shell 110 and inner device shell 120 are co-fabricated by a micro glassblowing process and share a common inner stem 130. Outer cap shell 110 may provide a housing for inner device shell 120 and provide an in-situ vacuum sealing capability. Inner stem 130 and the outer shell 110 may be bonded to a substrate at a stem attachment point 135 and at the outer shell rim 115, respectively. Bonding dual-shell structure 100 can provide a fixed-fixed anchor for the resonator structure and for vibration of inner device shell 120 shell. According to another embodiment, a fixed-fixed anchor configuration of dual-shell structure 100 provides improved structural rigidity, high-g shock survivability, and allow for operation through shock and external vibrations. Inner device shell 120 may be configured to vibrate due to motion, acceleration, environmental changes, etc. of the structure. According to one embodiment, inner device shell 120 can operate to provide one or more degenerate wineglass modes using capacitive excitation and detection to perform the gyro operation.

According to one embodiment, dual-shell structure 100 may be an oven-controlled sensor. By way of example, dual-shell structure 100 may be used with a temperature controlled (e.g., heated, etc.) isolation stage whose temperature is actively controlled so that sensor output is expected not to change when the surrounding temperature changes. The surface of the outer cap shell 110 can be coated with a low emissivity material for low power ovenization as well as radiation protection.

One or more processes are described herein for co-fabrication of outer cap shell 110 and inner device shell 120 including high-temperature glassblowing of triple-stacked wafers with concentric cavities. According to certain embodiments, concurrent glassblowing forms dual-shell structure 100 such that post-fabrication alignment and bonding of the outer cap shell 110 to the device shell 120 is eliminated. According to one embodiment, dual-shell structure 100 is formed from fused quartz. Elements of the resonator may be co-fabricated such that the structure, while being discussed as having separate portions, that is a uniform structure. Dual-shell structure 100 may also include one or more additional materials or support the addition of materials by way of layering and deposits according to one or more embodiments.

As mentioned above, dual-shell structure 100 is shown in a partial cutaway representation. According to one embodiment, dual-shell structure 100 may include a hemispherical outer cap shell 110 that fully encloses inner device shell 120 in its entirety (see FIG. 12A for example), the cutaway section in FIG. 1 is for illustration only of the structure.

According to one embodiment, outer cap shell 110 includes dome shape having an outer surface and an inner surface 111, the outer surface of outer cap shell 110 and inner surface 111 terminate into the outer shell rim 115. According to one embodiment, outer shell rim 115 is configured to interface with a substrate to thus seal the inner portion of outer cap shell 110. Outer shell rim 115 can provide support for the overall structure and the rim extends beyond dome shape to form a lip having a bottom surface for bonding.

According to one embodiment, dome shape of outer cap shell 110 can include an indentation 131 that may provide conical cavity. Indentation 131 may be a recess in the central portion of the dome structure and outer surface of outer cap shell 110, the bottom of indentation 131 may interface with common stem 130, and in particular the top portion of common stem 130.

According to one embodiment, outer cap shell 110 can support one or more layers or deposits of material including piezo material and/or metal material. The one or more layers may be a piezo layer applied to a portion or the entire exterior dome surface of the outrace cap shell. As will be described in more detail below, one or more electrode configurations may be provide to outer cap shell. According to one embodiment, the dome shape of outer cap shell 110 includes an inner surface and an outer surface as shown in FIG. 1.

According to one embodiment, inner device shell 120 includes material that extends out from the inner stem with a curved shape, such as a hemispherical shape with the central portion co-fabricated with the common stem 130. According to one embodiment, the connection point between inner device shell 120 and common stem 130 and the extension of inner device shell 120 matches or resembles the dome like architecture of the outer cap shell 110. As such, inner device shell 120 curves down from its connection with common stem 130. Inner device shell 120 can include a top surface 112 and inner surface. Inner device shell 120 may be separated from the inner surface 111 of outer cap shell 120. Inner device shell 120 does not contact the substrate such that the rim/terminal edge 125 of inner device shell 120 does not include a lip and does not contact a substrate.

According to one embodiment, common inner stem 130 relates to a central pillar of the resonator structure. Common inner stem 130 includes a stem attachment point 135 that relates to the bottom portion of the stem and that can be bonded to a substrate, whereas a top of common inner stem 130 is formed with outer cap shell 120. According to one embodiment, inner device shell 120 extends from common inner stem 130 at a point separated from a connection of outer cap shell 110 with common inner stem 130.

According to one embodiment, dual-shell structure 100 may utilize fused quartz as the core sensing element for timing and inertial navigation applications. The structure of dual-shell structure 100 in a resonator can improve shock survivability and reduce vibration sensitivity by providing a fixed-fixed anchor for shell attachment, and stiffening the spurious tilt and out-of-plane modes of vibration.

While dual-shell structure 100 is described in FIG. 1 as having certain elements and features, it should be appreciated that the embodiments described with respect to FIG. 1 may be applied to other embodiments described herein.

FIGS. 2A-2F show a graphical representation of dual-shell structure fabrication according to one or more embodiments. One or more fabrication processes are provided that allow for formation and generation of a dual-shell structure (e.g., dual-shell structure 100 of FIG. 1). FIGS. 2A-2F provide graphical representations of one or more fabrication operations and may be employed to form a fused quartz dual-shell structure. One or more operations and processing operations of FIGS. 2A-2F may be employed to form a dual-shell structure including dual-shell resonator structures according to one or more embodiments.

Embodiments described herein for fabrication of dual-shell structures 100 may be based on wafer bonding and high-temperature glassblowing processes. Fabrication may include pre-etching cavities on a cap fused quartz (FQ) wafer 210 and a device FQ wafer 220. Pre-etching may be based on and/or include an isotropic wet etching process using Hydrofluoric (HF) acid (48 wt. % in water solution). FIG. 2A is a side sectional view of a device wafer 220 cavity etch for the exemplary dual-shell structure. FIG. 2B is a side section view of a cap wafer 210 cavity etch for the exemplary dual-shell structure.

FIG. 2C is a side section view of a triple wafer bonding for a dual-shell structure, wherein the triple wafer bonding is a substrate/device/cap triple stack plasma-assisted wafer bonding. The device wafer 220 may be bonded to the substrate wafer 210 to form a substrate pair. For example, in FIG. 2C, device wafer 220 is bonded to a blank FQ substrate wafer 240, and the cap wafer 210 is aligned and bonded to the substrate/device pair 220/240 using plasma-assisted wafer bonding. The substrate/device/cap wafer stack 200 includes an array of aligned cavities including a cap cavity 217 in the device wafer 220 and device cavity 227 in cap wafer 210. According to one embodiment, cap wafer 210 is bonded and aligned to the substrate pair to form a wafer stack with aligned cavities including a cap cavity and a device cavity. According to one embodiment, an outer cap shell, inner device shell and common stem are formed by triple stacked wafers with concentric cavities, such as device wafer 220 bonded to a blank FQ substrate wafer 240, and the cap wafer 210 is aligned and bonded to the substrate/device pair 220/240.

FIG. 2D is a side section view of the exemplary dual-shell structure undergoing high-temperature glassblowing. Glassblowing of the wafer stack is performed to form a dual-shell structure, the glassblowing is performed at temperatures greater than 1500° C. At the glassblowing temperature, wherein the glassblowing temperature is set to a value greater than 1500° C., the pressure builds up simultaneously inside the two cavities 217 and 227, and viscosity of FQ layers drops. The encapsulated cavities 217 and 227 expand and create a 3D dual-shell structure (e.g., dual shell structure 100) with a self-centered stem (e.g., common inner stem 130). During the viscous deformation of FQ, the surface tension would minimize the surface area and form a hemitoroidal (or hemispherical) geometry.

FIG. 2E is a side section view of a dual-shell structure, wherein the substrate has been removed and planarized by lapping. Outer cap shell 110 is a hemispherical dome configured to house the inner device shell 120 and the outer cap shell, inner device shell and stem are fused quartz. The inner device shell 120 was released by removing the substrate and polished using parallel back-lapping. The inner shell may be released by removing the substrate layer for integration of dual-shell resonator with a flat substrate for electrostatic actuation and detection.

FIG. 2F is a side section view of assembly of a dual-shell structure on a substrate with through wafer vias, wherein the dual-shell structure and the substrate are joined by means of eutectic bonding in a vacuum furnace. According to one or more embodiments, boding of the outer cap shell and common stem to a flat substrate can include one or more of eutectic bonding, metal-metal compression bonding, and a low-outgassing conductive adhesives bonding, wherein a capacitive gap is provided between the inner device shell and the flat substrate. The outer shell rim 115, inner shell rim 125, and the inner stem 130 were planarized in the lapping step and formed a reference plane for subsequent integration of the dual-shell resonator 100 with a flat substrate 300 for electrostatic actuation and detection (see FIGS. 4A-4C). In one embodiment, a thin-film metal conductive coating 228 is then applied to the inner surface of the inner shell 120 and the surface of a section of the inner stem 130. In one embodiment, a thin-film metal bonding coating 229 is similarly applied to a section of the outer shell rim 115. In one embodiment, the thin-film metal coatings 228 and 229 may include one or mote of chromium (Cr), gold (Au), iridium (Ir), titanium nitride (TiN), and platinum (Pt).

Figure 2G:
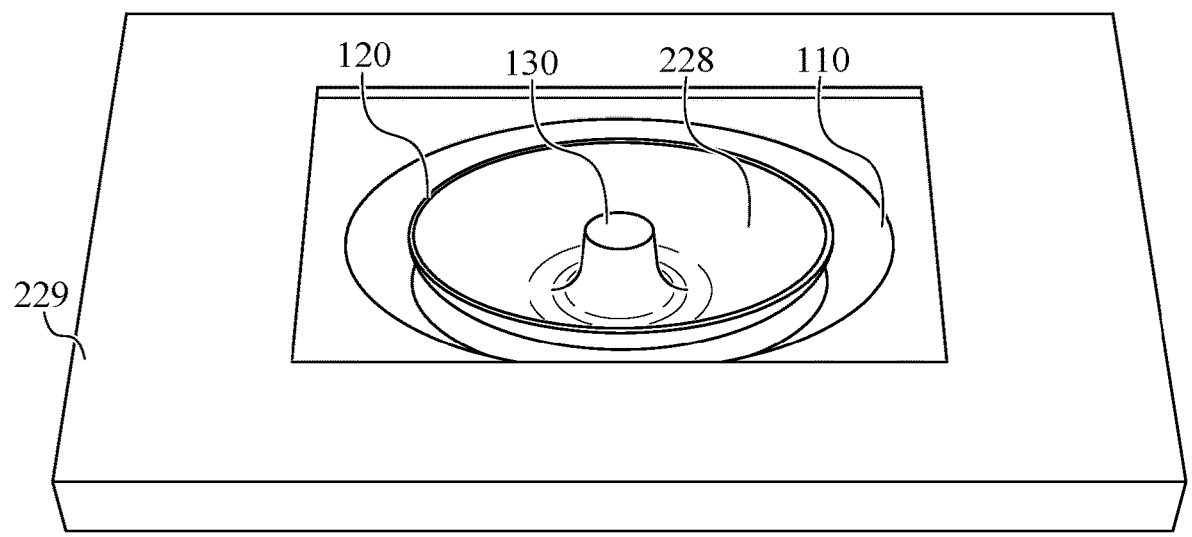
FIG. 2G shows a graphical representation of a dual-shell structure according to one or more embodiments.

FIG. 2G shows a graphical representation of a dual-shell structure according to one or more embodiments. A bottom perspective view is shown in FIG. 2G of a fabricated prototype of a fused quartz dual-shell structure of FIG. 2F. In one embodiment, the outer cap shell 110 and inner stem 130 may be bonded to a flat substrate by means of eutectic bonding, metal-metal compression bonding, or a low-outgassing conductive adhesives bonding at points 140. Once the outer shell 110 and the inner stem 130 are bonded to the flat substrate, the inner shell rim 125 may have a capacitive gap remaining between it and a flat substrate. Adding a thin-film metal (such as thin-film metal 228) as a conductive coating provides fused quartz insulator material with conductive coating to provide the electrical conductivity for electrostatic operation.

FIGS. 3A-3G show a graphical representation of dual-shell structure fabrication according to one or more embodiments. FIGS. 3A-3G provide graphical representations of a substrate serving as a base for a fused quartz dual-shell structure. One or more operations and processing operations of FIGS. 3A-3G may be employed to form a dual-shell structure (e.g., dual shell structure 100) according to one or more embodiments. FIGS. 3H-3I provide graphical representations of a dual-shell structure according to one or more embodiments.

Figures 3A, 3B, 3C, 3D, 3E, 3F, 3G:
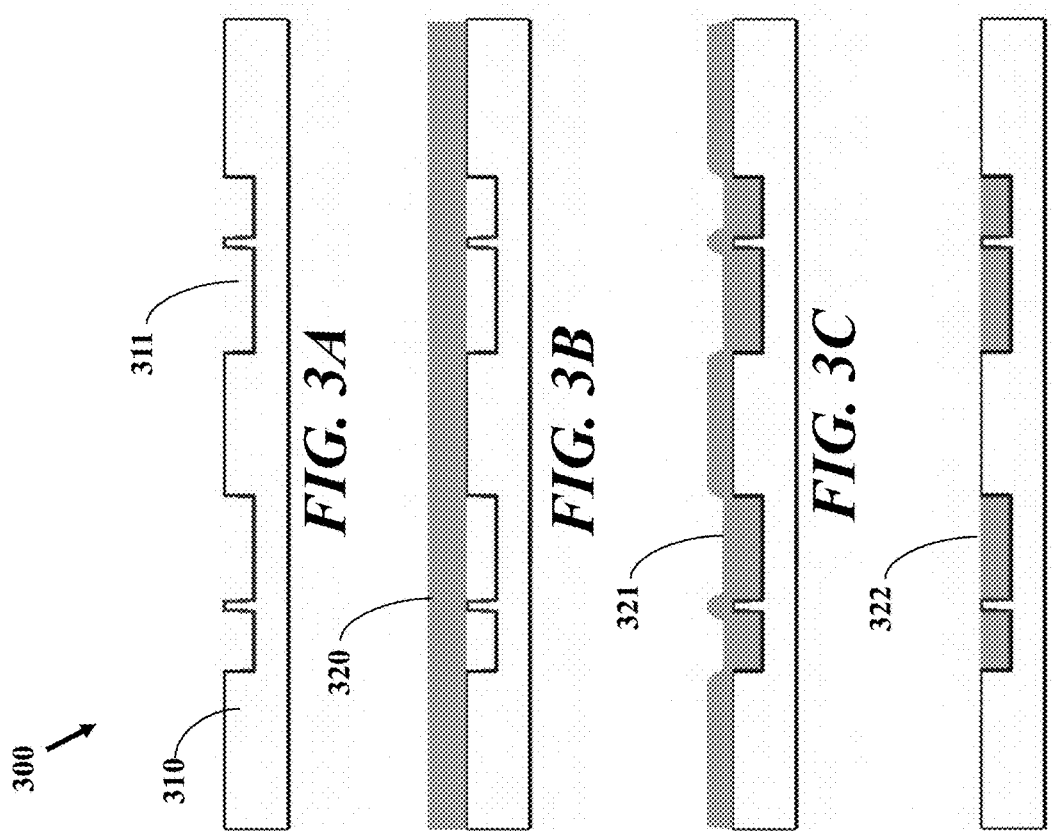
FIGS. 3A-3G show a graphical representation of a dual-shell structure fabrication according to one or more embodiments.
Figures 3H, 3I:
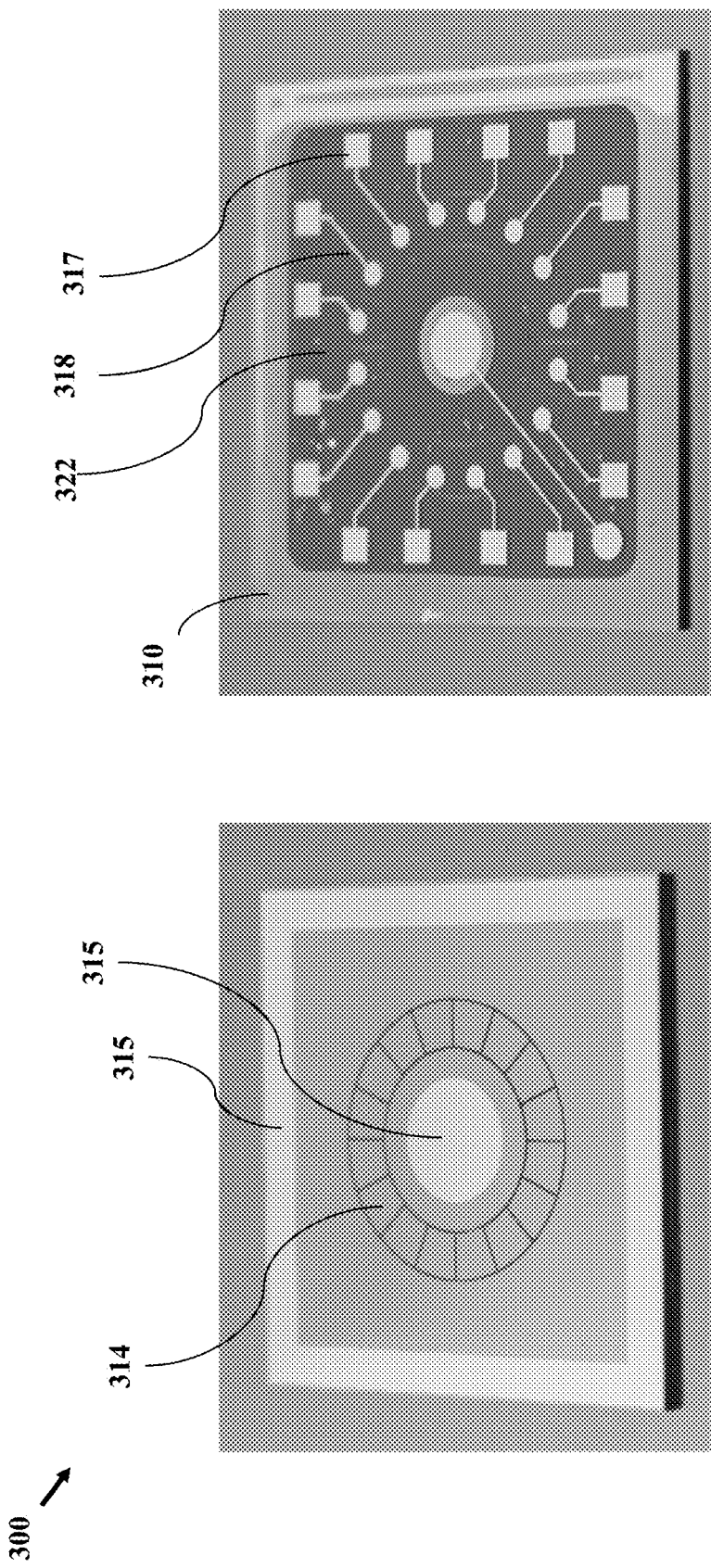
FIG. 3H is a graphical representation of an electrode substrate according to one or more embodiments.
FIG. 3I is a graphical representation of an electrode substrate according to one or more embodiments.

FIG. 3A is a side section view of a cavity etch in a silicon wafer 310 to serve as the base of substrate 300, which may be a flat substrate. The silicon wafer 310 may include a plurality of etched trenches 311 to serve as channels for glass reflow in a later step. FIG. 3B is a side section view of a BSG wafer 320 bonded to the silicon wafer 310 in vacuum.

FIG. 3C is a side section view of the substrate 300, wherein the substrate 300 is heated to above 900° C. and the glass 321 of the BSG wafer 320 has reflowed into the trenches 311 of the silicon wafer 310. FIG. 3D is a side section view of the substrate 300, wherein the excess glass 321 has been removed and the surface of the substrate 300 has been planarized, thereby leaving planarized glass 322 in the etched trenches 311.

Figure 4A:
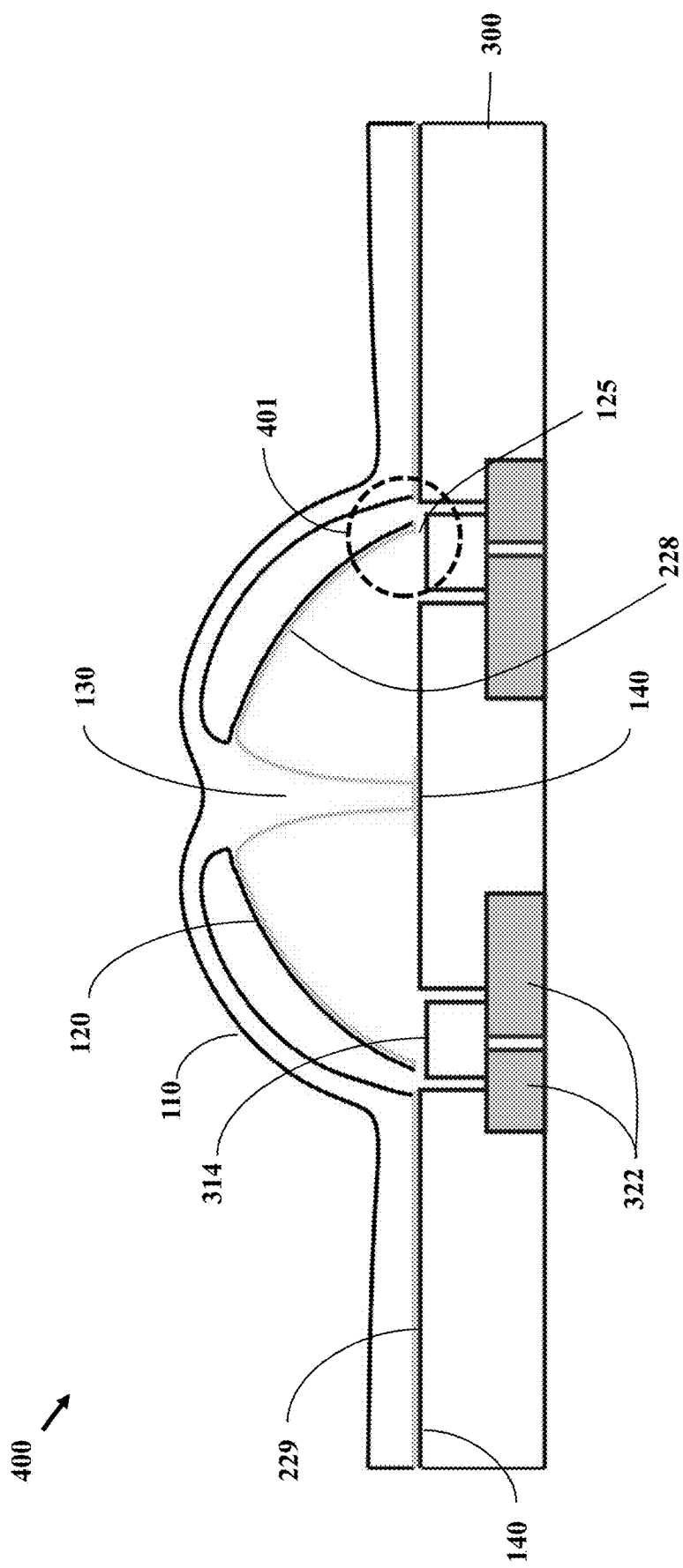
FIGS. 4A-4C illustrates a dual-shell resonator according to one or more embodiments.
Figure 4B:
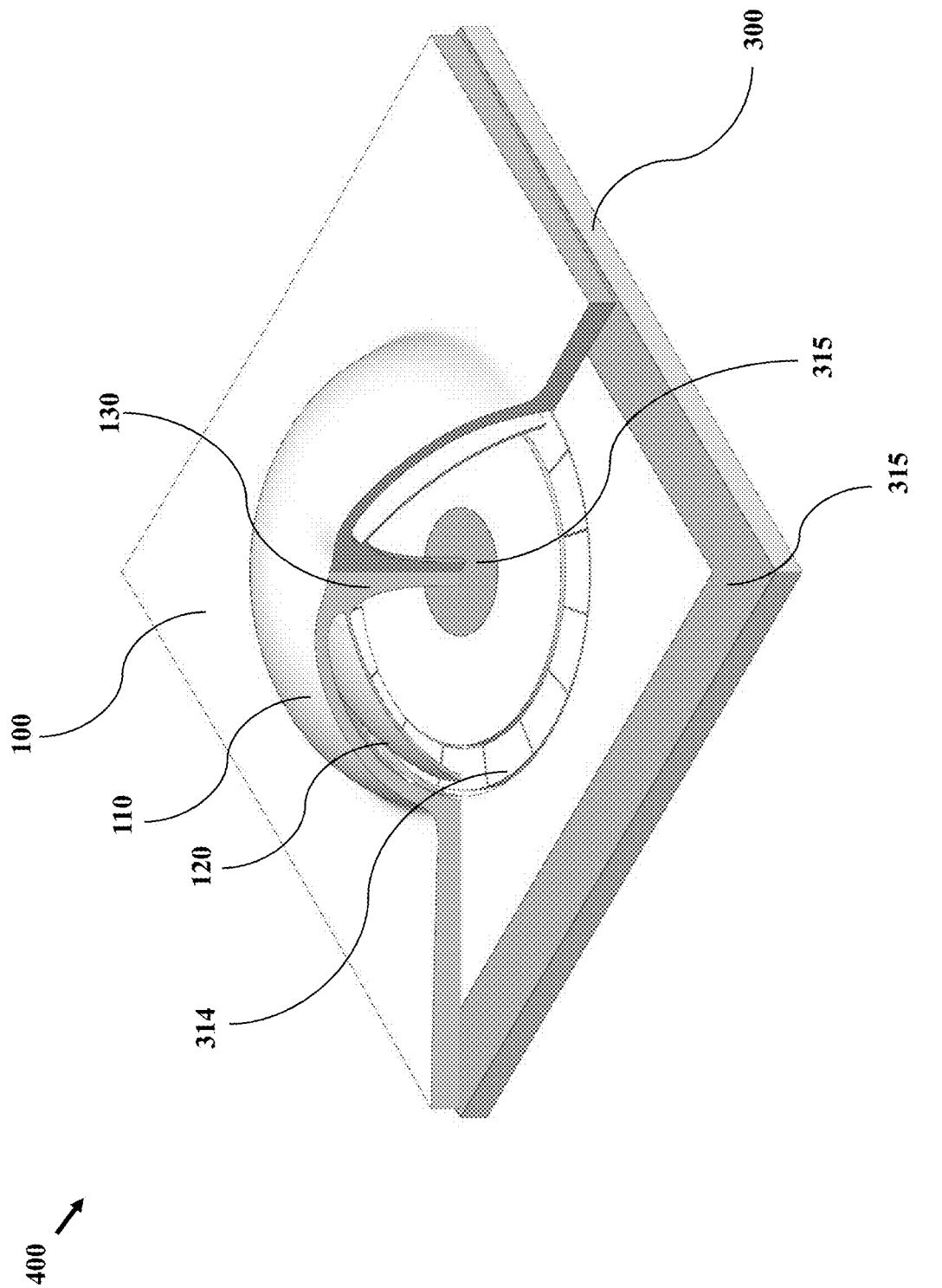
Figure 4C:
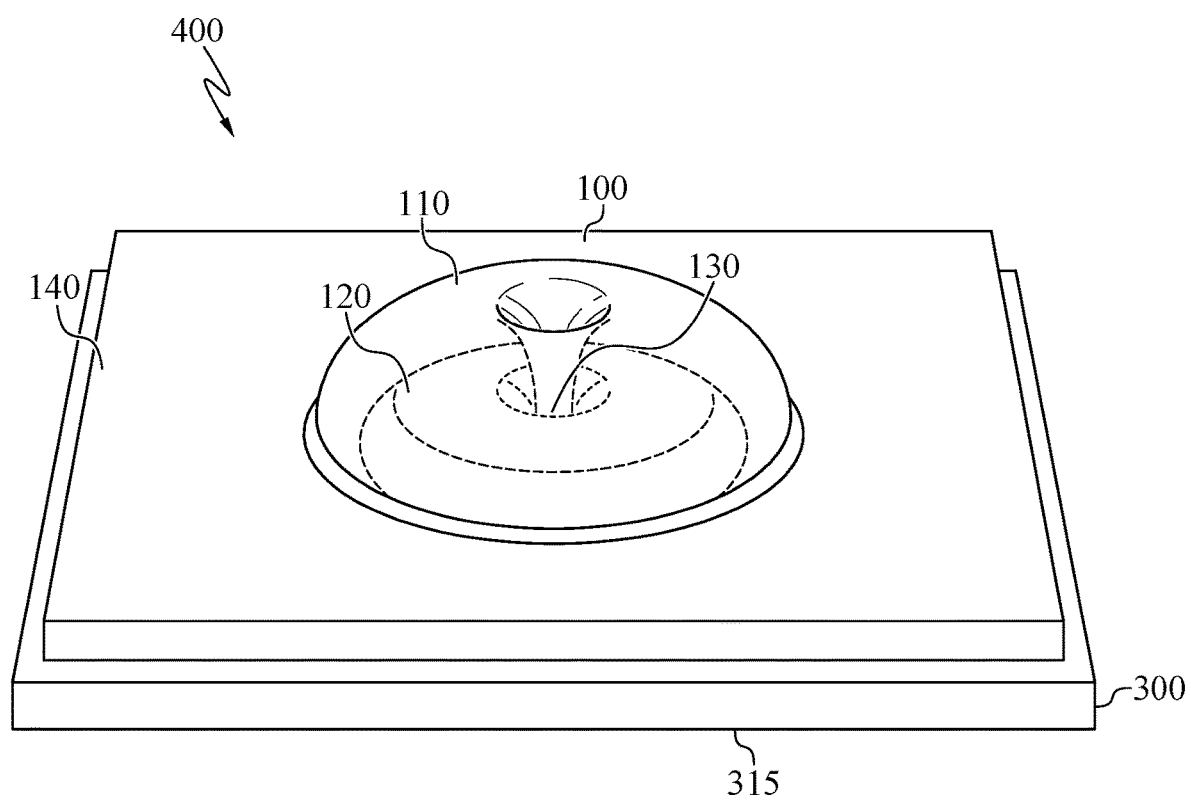

FIG. 3E is a side section view of the substrate 300, wherein a deep reactive-ion etching (DRIE) process is used to etch the backside of the silicon wafer 310 to define a set of capacitive gaps (such as gaps shown in FIGS. 4A-4C). FIG. 3F is a side section view of the substrate 300, wherein a DRIE process is used again to etch the backside of the silicon wafer 310 to isolate the electrodes, thereby producing a pair of electrode isolation trenches 312. Once a shallow etching 313 for the capacitive gaps and the isolation trenches 312 are produced, a silicon via 314 remains for the excitation and detection of vibration of an inner device shell (e.g., inner device shell 120).

FIG. 3G is a side section view of the substrate 300, wherein gold 315 is selectively deposited on the substrate 300 in preparation for the subsequent eutectic bonding step and getter material 316 is deposited on the substrate 300 to ensure long term vacuum stability after hermetic encapsulation of the dual-shell structure 100. In one embodiment, once bonded, the gold 315 will bond the silicon wafer 310 to the thin-film metal bonding coating 229 applied to the outer shell rim 115 and the thin-film metal conductive coating 228 applied to the inner stem 130. Coating on the outer shell edge may be bonded to gold 315 in the bonding area. The bonding can be performed using eutectic bonding method, or metal-metal compression bonding, or using a low-outgassing conductive adhesives bonding.

FIG. 3H is a top perspective view of an exemplary embodiment of a fabricated prototype of the electrode substrate 300 of FIG. 3G. FIG. 3H shows gold 315 bonding locations and silicon vias. FIG. 3I is a bottom perspective view of a fabricated prototype of the electrode substrate 300 of FIG. 3G. In one embodiment, the bottom side of the electrode substrate 300 includes a plurality of contact pads 317, wherein each contact pad 317 is connected to a metal trace 318 configured to route signals. In one embodiment, each contact pad 317 and metal trace 318 pair is connected to a silicon via 314.

FIGS. 4A-4C illustrate a dual-shell resonator according to one or more embodiments. According to one embodiment, dual-shell resonator 400 includes a dual-shell structure 100 joined to a substrate 300. FIG. 4A is a side section view of assembly of an exemplary embodiment of a dual-shell resonator 400 comprising a dual-shell structure 100 on a substrate 300 with through wafer vias 314. According to one embodiment, dual-shell structure 100 and the substrate 300 are joined by means of eutectic bonding in a vacuum furnace. FIG. 4B is a cutaway isometric view of the dual-shell resonator 400 of FIG. 4A. FIG. 4C is a perspective view of a fabricated prototype of the dual-shell resonator 400 of FIG. 4A. In one embodiment, the planarized glass 322 isolates the vias 314 from the surrounding substrate material. In one embodiment, the outer shell 110 and inner stem 130 may be bonded to the substrate 300 by means of eutectic bonding at points 140. Once the outer cap shell 110 and the inner stem 130 are bonded to the flat substrate 300, the inner shell rim 125 may have a capacitive gap 401 remaining between it and the flat substrate 300. Outer cap shell 110 may have a hemispherical dome configured to house the inner device shell 120, and the outer cap shell 110, inner device shell 120, and stem 130 are fused quartz.

According to one embodiment, the inner device shell 120 is configured to operate using at least one of capacitive excitation and detection relative to the substrate layer. A sensor may be configured to measure vibrations of the inner device shell. In one embodiment, the dual-shell resonator 400 is capable of sensing directional motion by detecting vibrations that lead the inner shell rim 125 to contact one of the vias 314, thereby creating a conductive path along the contact pad 317 and metal trace 318 of the inner stem 130, through the thin-film metal conductive coating 228, and then along the contact pad 317 and metal trace 318 of the contacted via 314. In one embodiment, each of the plurality of contact pads 317 may be bonded to an electronic circuit or ASIC to enable sensory functions. In one embodiment, structures and fabrication methods described herein may include applying a thin-film metal conductive coating to an inner surface of the inner device shell 120 and common stem 130. Similarly, a thin-film metal bonding coating may be applied to a section of the outer cap shell rim.

Figure 5:
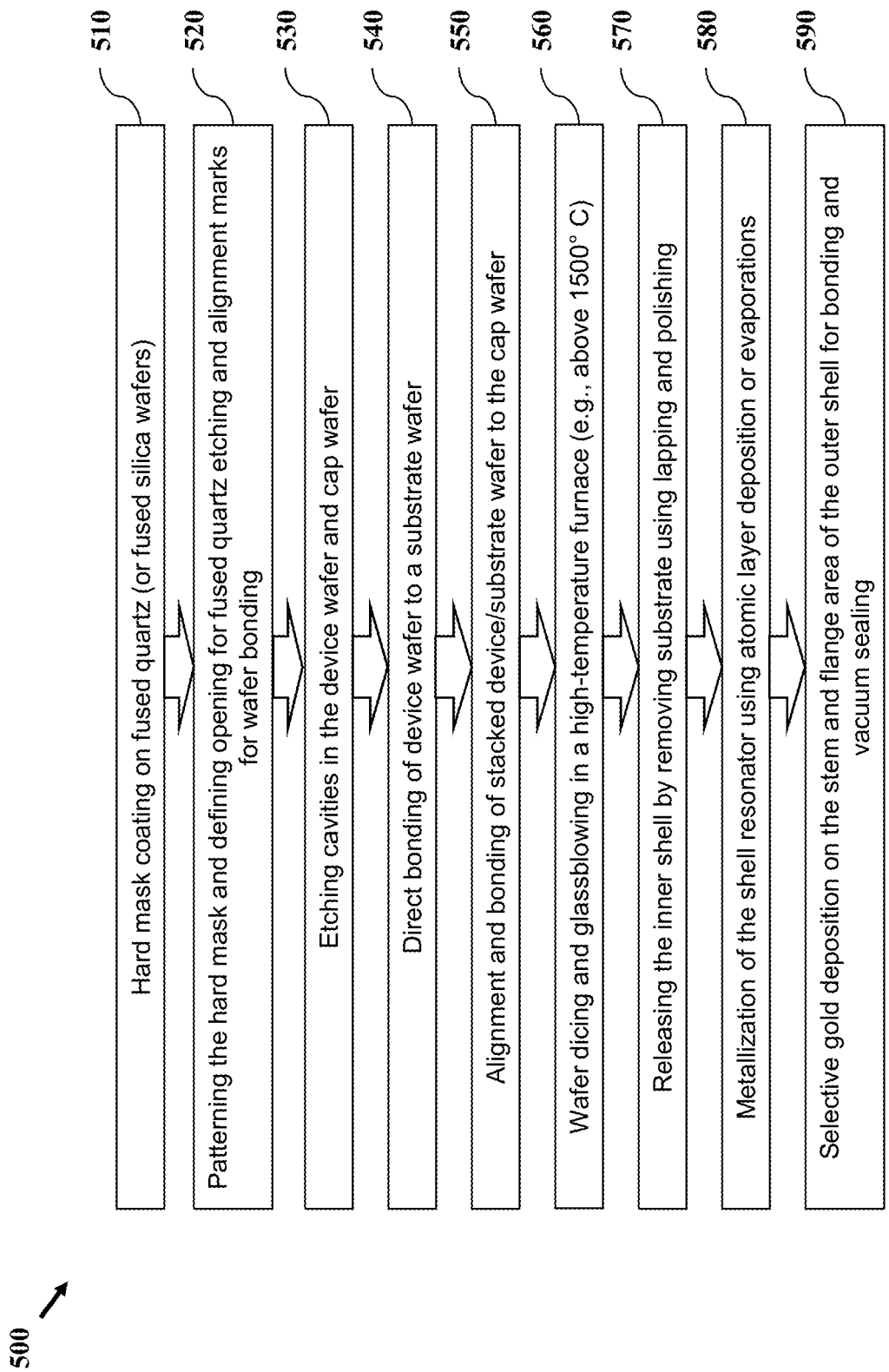
FIG. 5 illustrates a process for fabricating a dual-shell resonator according to one or more embodiments.

FIG. 5 illustrates a process for fabricating a dual-shell resonator according to one or more embodiments. According to one embodiment, process 500 may be employed for fabricating the dual-shell resonator 100 of FIGS. 2A-2F. In one embodiment, at block 510, the resonator fabrication process 500 includes coating a hard mask onto fused quartz. Alternatively, block 510 may use fused silica wafers instead of fused quartz.

In one embodiment, at block 520, the resonator fabrication process 500 includes patterning the hard mask and defining an opening for fused quartz etching and alignment marks for the wafer bonding steps. At block 530, the resonator fabrication process 500 etches cavities in the device wafer 220 and the cap wafer 210 (see FIGS. 2A and 2B). At block 540, the resonator fabrication process 500 directly bonds the device wafer 220 to a substrate wafer 240.

In one embodiment, at block 550, the resonator fabrication process 500 aligns and bonds the stacked device/substrate wafer 220/240 to the cap wafer 210 (see FIG. 2C). At block 560, the resonator fabrication process 500 dices the wafer stack 200 and conducts a glassblowing operation in a high-temperature furnace operating at temperatures greater than 1500° C. (see FIG. 2D). In one embodiment, at block 570, the resonator fabrication process 500 releases the inner shell 120 by removing the substrate 240 with a lapping and polishing operation (see FIG. 2E).

In one embodiment, at block 580, the resonator fabrication process 500 metallizes the dual-shell resonator 100 by using atomic layer deposition or an evaporation process (see FIG. 2F).

In one embodiment, at block 590, the resonator fabrication process 500 selectively deposits gold on the inner stem 130 and the flange area of the outer shell 115 to prepare the dual-shell resonator 100 for bonding and vacuum sealing.

Figure 6:
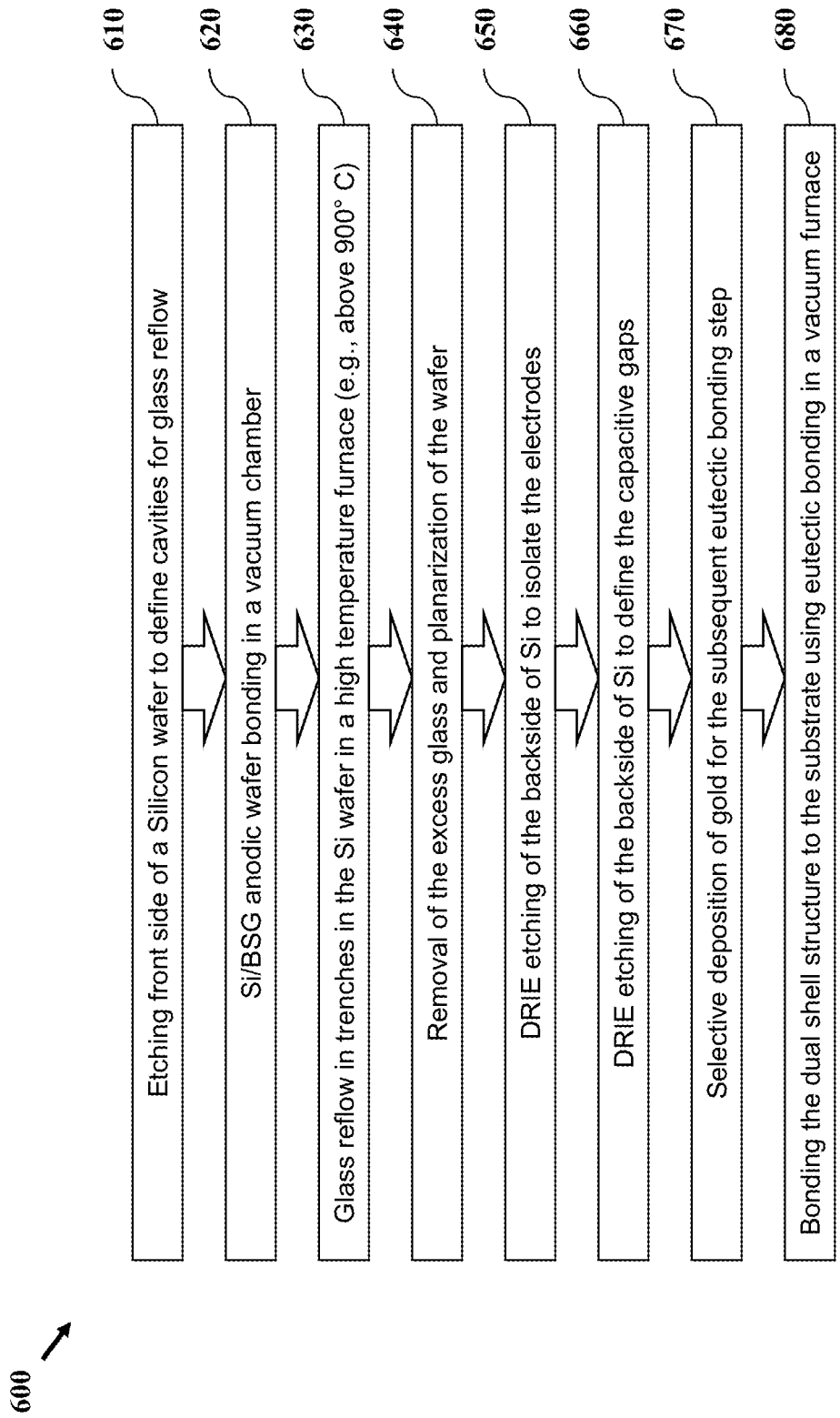
FIG. 6 illustrates a process for fabricating a substrate according to one or more embodiments.

FIG. 6 illustrates a process for fabricating a substrate according to one or more embodiments. Process 600 may be employed for fabricating the substrate of FIGS. 3A-3I.

In one embodiment, at block 610, the substrate fabrication process 600 etches the front side of a silicon wafer 310 in order to define cavities 311 for glass reflow (see FIG. 3A). In one embodiment, at block 620, the substrate fabrication process 600 bonds the silicon wafer 310 with a BSG wafer 320 in a vacuum chamber (see FIG. 3B). At block 630, the substrate fabrication process 600 melts the BSG wafer 320 using a high temperature furnace set to a temperature above 900° C. This causes the material of the BSG wafer 320 to flow into the cavities 311 of the silicon wafer 310, thereby producing the glass reflow 321 (see FIG. 3C).

In one embodiment, at block 640, the substrate fabrication process 600 removes the excess glass reflow 321 and planarizes the silicon wafer 310, thereby producing planarized glass 322 (see FIG. 3D). In one embodiment, the step performed at block 640 may additionally planarize the substrate 300 as a whole, including the silicon wafer 310, to produce a uniform plane on the front side of the substrate 300.

In one embodiment, at block 650, the substrate fabrication process 600 uses a DRIE process on the back side of the silicon wafer 310 to produce a pair of electrode isolation trenches 312 for isolating the electrodes of the final product (see FIG. 3E).

In one embodiment, at block 660, the substrate fabrication process 600 again uses a DRIE process on the back side of the silicon wafer 310 to create a shallow etching 313 on top of the silicon vias 314 to define the capacitor gaps (see FIG. 4A). In one embodiment, at block 670, the substrate fabrication process 600 selectively deposits gold 315 on the silicon wafer 310 for the subsequent eutectic bonding step (see FIG. 3G). In one embodiment, at block 680, the substrate fabrication process 600 bonds the dual-shell structure 100 produced by the resonator fabrication process 500 to the substrate 300 produced by the substrate fabrication process 600 by means of eutectic bonding in a vacuum furnace (see FIGS. 4A-4C).

Figure 7:
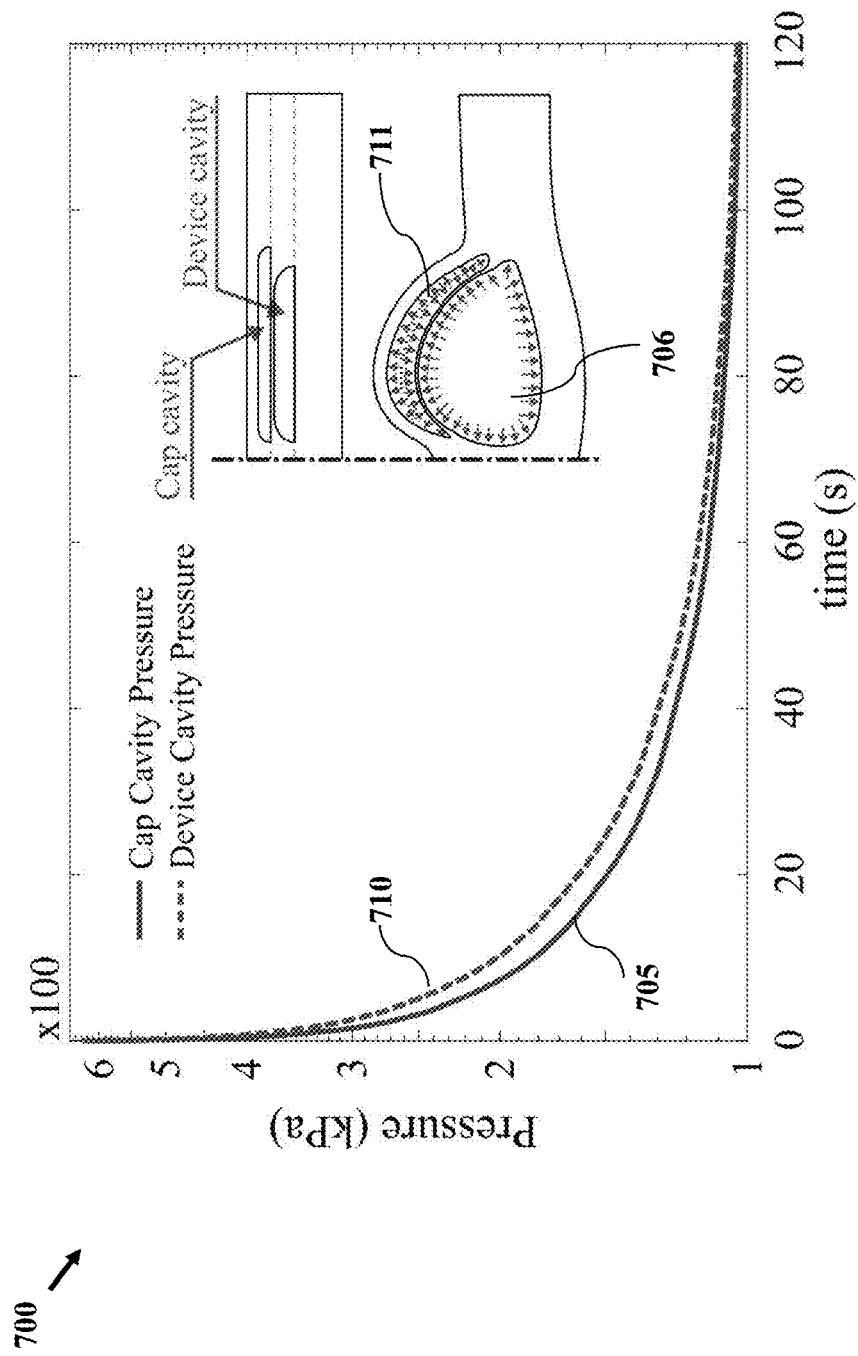
FIG. 7 is a graphic illustration of simulation results according to one or more embodiments.
Figure 8:
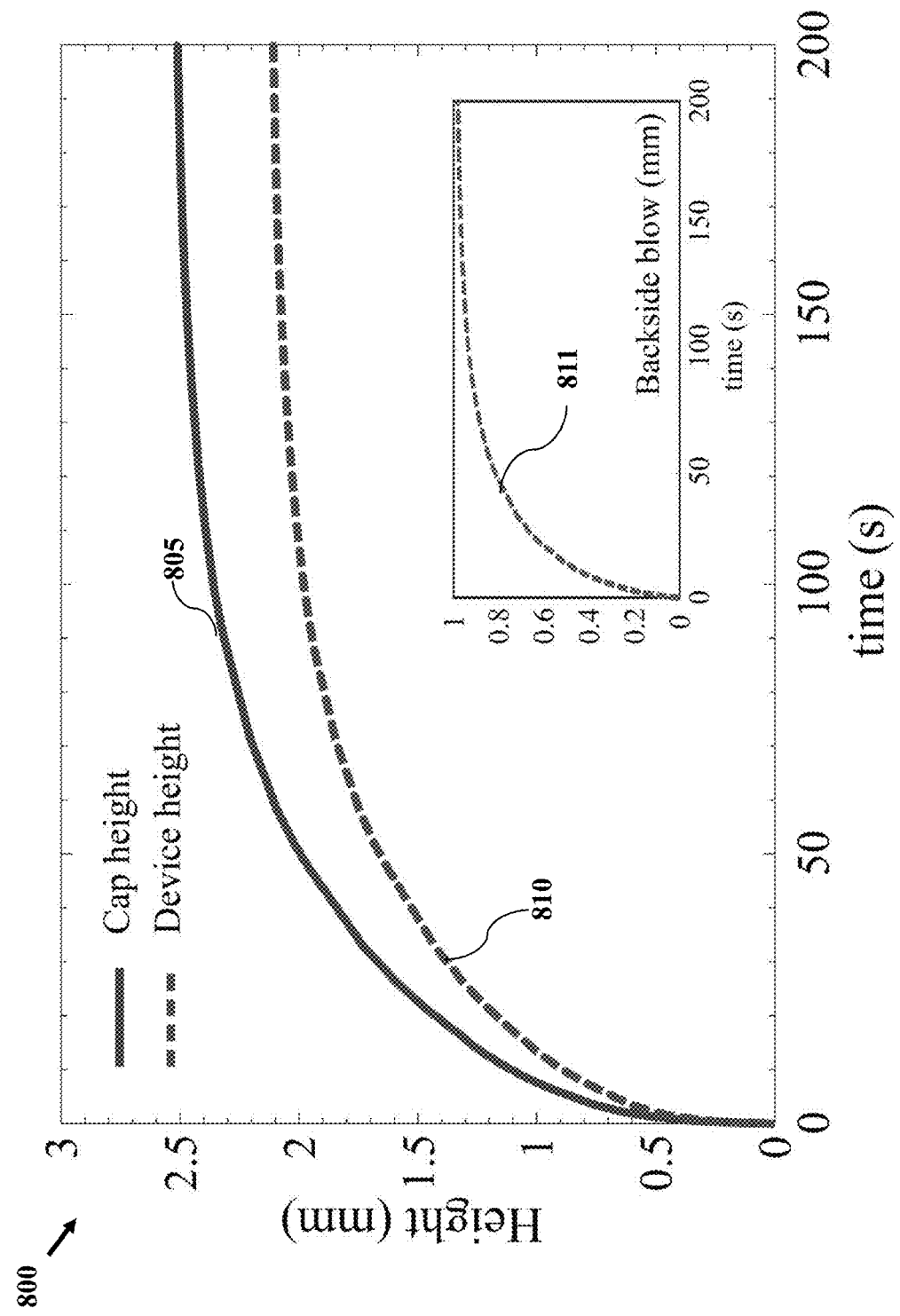
FIG. 8 is a graphic illustration of simulation results according to one or more embodiments.

FIG. 7 is a graphic illustration of simulation results according to one or more embodiments. Pressure diagram 700 illustrates of pressure change in the cap cavity 711 and device cavity 706 in a generic glassblowing simulation, wherein the pressure drops as cavity volume increases and reaches an equilibrium with the ambient pressure. Diagram 700 shows cap cavity pressure 705 pressure over time compared to device cavity pressure 710. FIG. 8 is a graphic illustration of an evolution of cap shell height (e.g., outer cap shell 110) and device shell (e.g., inner device shell 120) height in a generic glassblowing simulation, demonstrating the self-limiting nature of the process, wherein as cavity volume increases, the deformation rate reduces. Height diagram 800 illustrates of cap height 805 and device height 810. The inset figure shows the deformation 811 due to blowing on the substrate side of the triple stack. The glassblowing may be a self-limiting process. The rate of deformation reduces over time until an equilibrium condition is reached and the 3D shell is fully developed. The final geometry of the glassblown shells (e.g., outer cap shell 110 and inner device shell 120) may depend on initial geometry and process parameters. The volume of the pre-etched cavity, initial thickness, radius, glassblowing temperature, pressure, and wafer bonding pressure define the final geometry of a glassblown shell.

The dual-shell glassblowing was simulated with a Newtonian isothermal fluid flow model with adaptive re-meshing in COMSOL Multi-physics FE Package. The thickness of the substrate, device, and cap wafer was 1 mm, 500 µm, and 500 µm, respectively, in all of the simulations. In this model, the instantaneous volume and pressure of the two cavities were calculated at each time step of the simulation. The initial volume of cavities was calculated based on the volume of the isotropic pre-etched cavities. It was assumed that wafers were bonded in atmospheric pressure and the initial pressure in the simulation was proportional to temperature rise. FIG. 7 demonstrates the pressure change in the cap cavity and device cavity during the simulation. As the pressure drops, the rate of deformation is reduced. The shells of a structure deform until the pressure reaches an equilibrium and limits the glassblowing height, FIG. 8. During the glassblowing, the bottom substrate would deform and change the geometry of the final structure. The larger backside blowing, the shell height would become smaller. In general, a thicker substrate wafer reduces the unwanted backside blowing.

Figure 9:
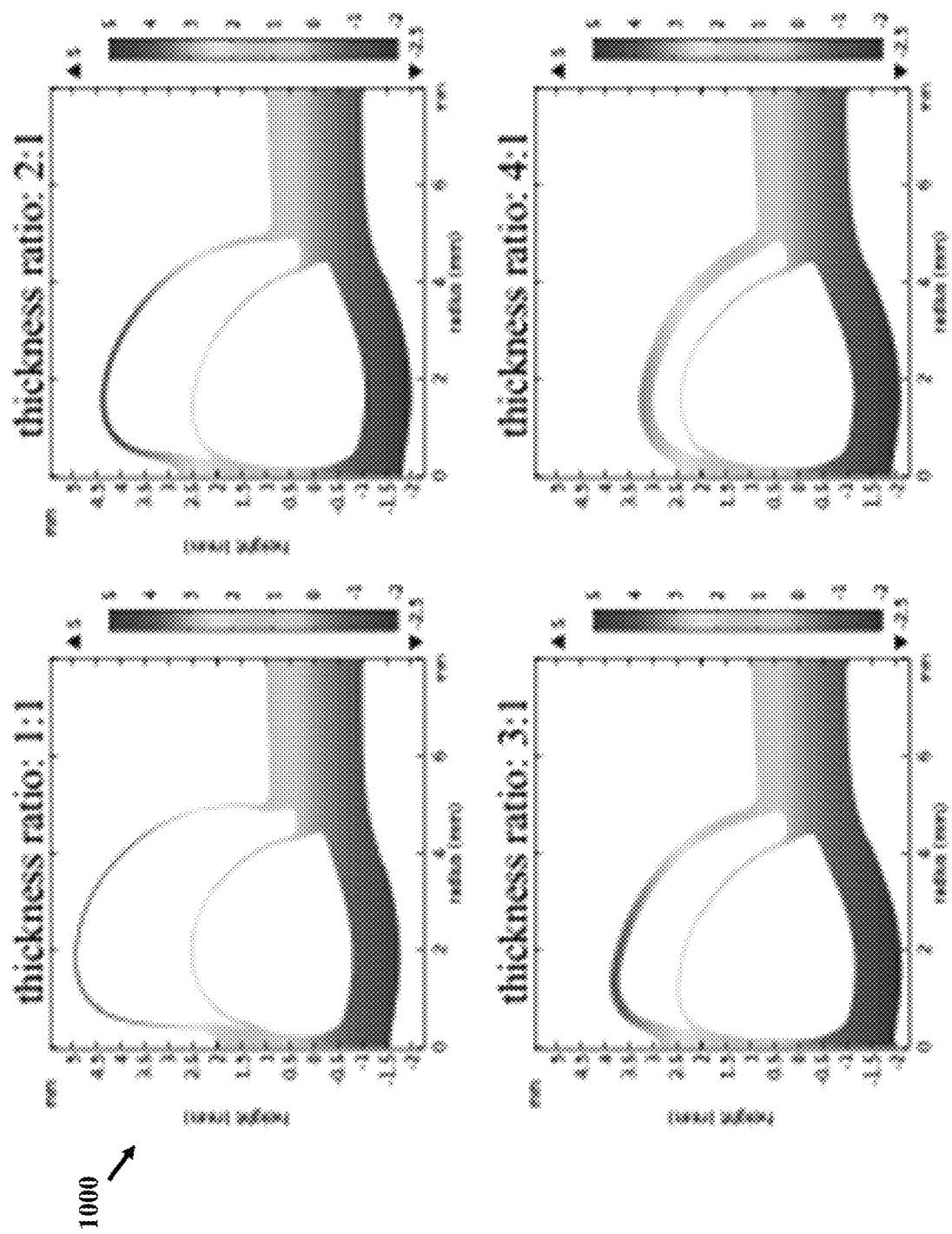
FIG. 9 is a graphic illustration of simulation results according to one or more embodiments.
Figure 10:
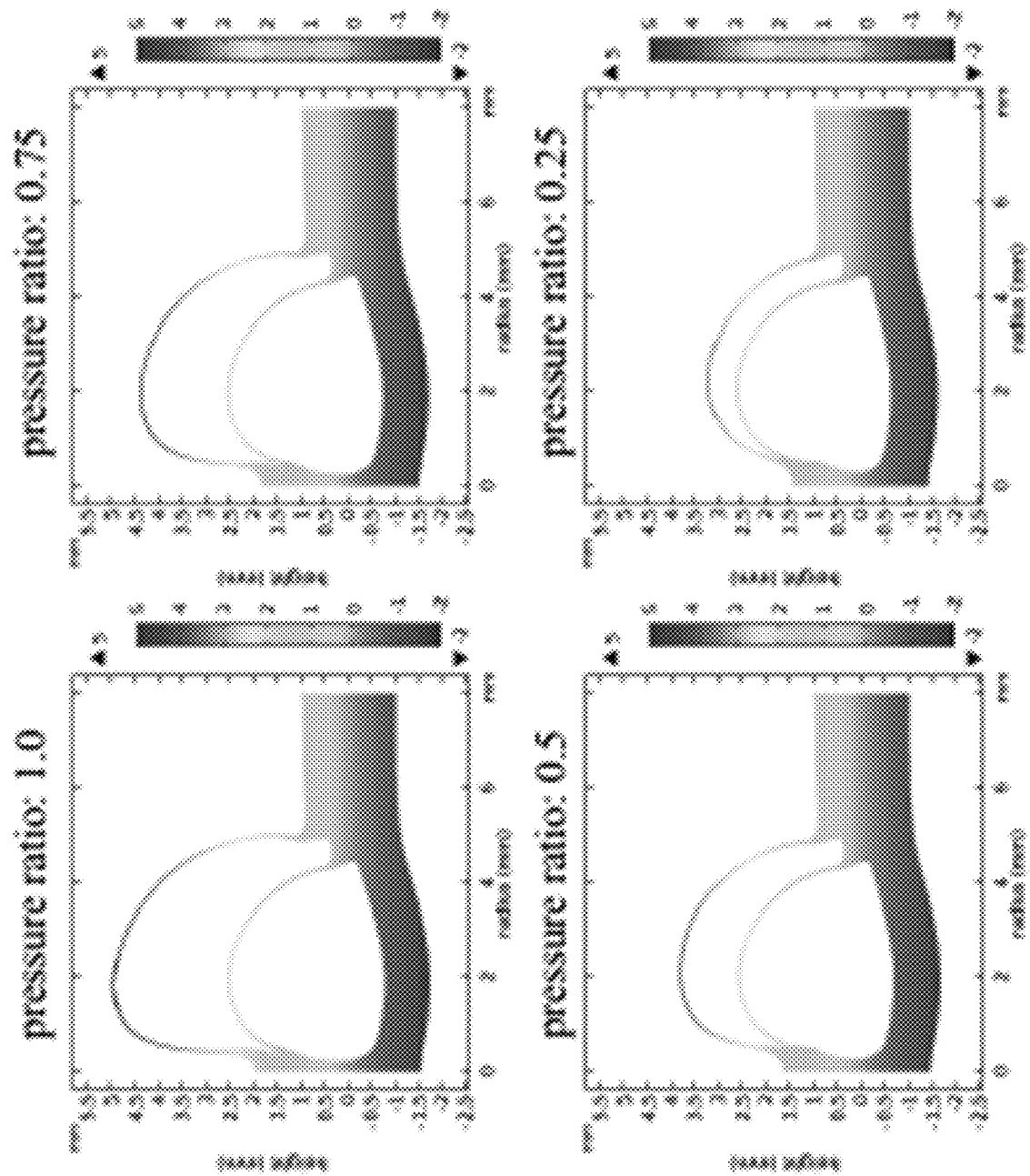
FIG. 10 is a graphic illustration of simulation results according to one or more embodiments.

FIG. 9 is a graphic illustration of simulation results according to one or more embodiments. Simulation results 900 are based on parametric finite element results of the dual-shell glassblowing simulations at different cap/device thickness ratios, wherein the device thickness was 100 µm, the device radius was 4.5 mm, and the cap shell radius was 5 mm in all cases. FIG. 10 is a graphic illustration of a set of parametric finite element results of the dual-shell glassblowing simulations at different cap/device pressure ratios. For simulation result 1000 the cap and device thickness were 100 μm, the device radius was 4.5 mm, the cap shell radius was 5 mm, and the device cavity pressure was 1 atm in all cases.

The dual-shell process was simulated for two cases. In the first case, the etch depth of cap wafer 210 was changed in a parametric FE simulation from 100 μm to 400 μm, and the etch depth of device wafer 220 was 400 μm. Thus, the thickness ratio of the cap layer 210 to the device layer 220 was varied from 4 to 1. FIG. 9 shows the predicted final geometry for four different thickness ratios based on height (y axis) compared to radius (x axis). The thinner the cap shell, the initial volume of the cap cavity would be larger, and subsequently, the cap shell would blow higher.

In the second case, shown in FIG. 10, the volume of the cap cavity 217 and device cavity 227 were constant. The initial pressure of the cap cavity 217 was varied to provide different cap-to-device pressure ratios, resembling the wafer bonding of the cap layer 210 at different pressures. The cap wafer 210 bonding at a lower pressure would reduce the blowing height of the cap shell 110. The simulation results revealed that a variety of dual-shell geometries could be realized by controlling the pressure ratio and thickness ratio of the device wafer 220 and cap wafer 210.

FIG. 11A illustrates a sectional view of a double-cavity triple stack according to one or more embodiments. FIG. 11B is a perspective view of a bonded wafer stack according to one or more embodiments. In FIG. 11A, a double-cavity triple stack 1100 (e.g., bonded stack 200) is shown FIG. 11B is a perspective view of an exemplary bonded wafer stack 1101 (e.g., bonded stack 200) showing the concentric cavities before glassblowing. High-purity FQ wafers with an initial thickness of 500 μm were used to fabricate the dual-shell structure. The wafers were coated with a 2 μm LPCVD doped polysilicon as a masking material for the isotropic wet etching. The device wafer 220 and the cap wafer 210 were time-etched in HF 48% to achieve 430 μm, and 250 μm etch depth, respectively. The device wafer was manually bonded to a 1 mm thick FQ substrate wafer 240. The substrate/device wafer stack 240/220 and the cap wafer 210 were aligned and bonded in an AML-AWB aligner wafer bonder. The plasma-assisted direct bonding in atmospheric pressure was used for both wafer bonding steps. FIG. 11A shows the cross-section of a triple-stack FQ die before the glassblowing. Fundamentally, the glassblowing process can be performed on the wafer scale using a high-temperature furnace with a uniform temperature distribution across the wafer. In the current fabrication process, the wafers were dies after the bonding step, and the glassblowing was performed on the die-level to operate the process in the uniform temperature zone of the furnace.

Figure 12B:
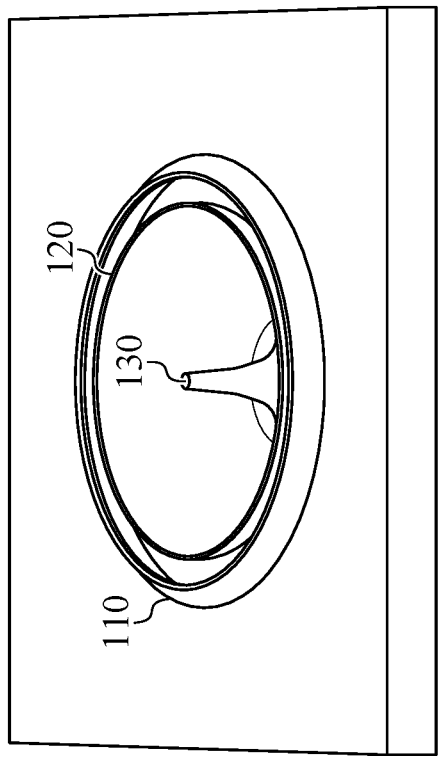
FIG. 12B illustrates a dual-shell die according to one or more embodiments.
Figure 12A:
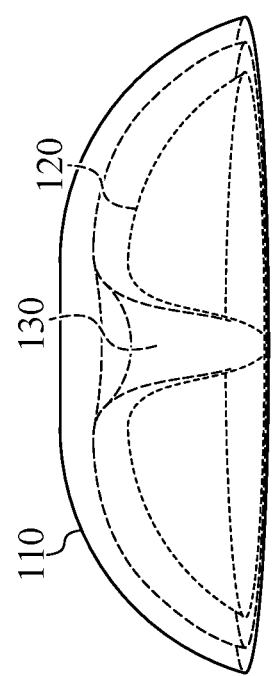
FIG. 12A illustrates a dual-shell structure having a metalized inner shell according to one or more embodiments.

FIG. 12A illustrates a dual-shell structure having a metalized inner shell according to one or more embodiments. FIG. 12B illustrates a dual-shell die according to one or more embodiments. In FIG. 12A a glass-blown dual-shell structure 100 fabricated using triple-stack wafer bonding and high temperature glassblowing is shown the inner shell 120 was metallized for better visibility. FIG. 12B is a perspective view of an exemplary released dual-shell die after substrate removal and planarization using back-lapping and polishing. According to one embodiment, a glassblowing process may be performed using a sliding tube Rapid Thermal Processing (RTP) furnace at 1800 K. The process time was between two to three minutes to fully develop a shell structure 100. FIG. 12 illustrates a dual-shell structure 100 after the glassblowing. The substrate was removed using the parallel back-lapping to release the inner shell 120. The rim of the inner shell 125 was polished using a 0.5 μm diamond abrasive polishing film.

Figure 13:
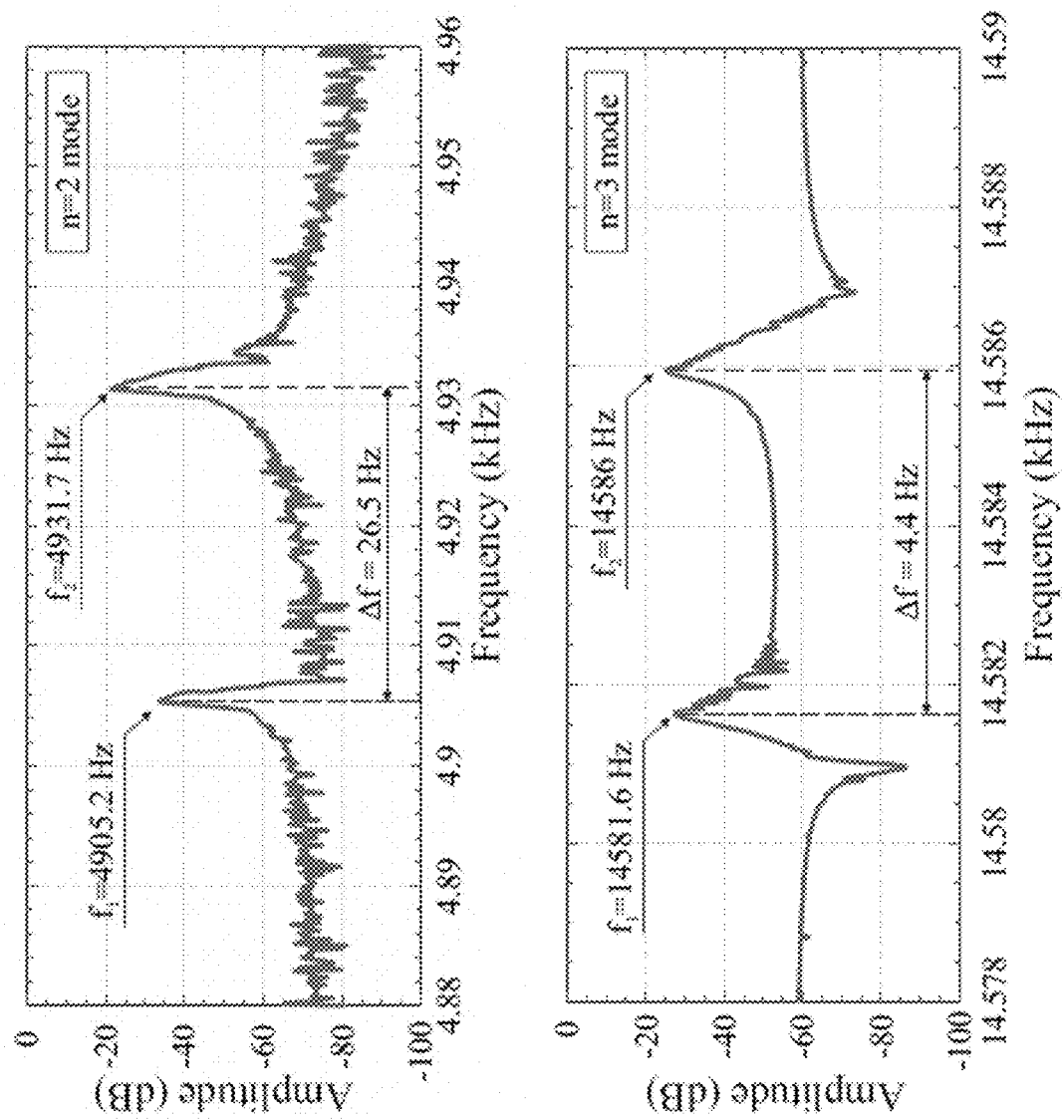
FIG. 13 illustrates frequency response according to one or more embodiments.

The frequency response of the released shell resonator prototype 100 was characterized using a bulk piezo stack for the excitation and a Laser Doppler Vibrometer (LDV) for detection. The cap shell 110 was attached to a bulk piezo stack, and the motion of the device shell 120 was captured from the rim area 125 using the LDV. FIG. 13 shows the frequency response of the inner shell 110 of the dual-shell structure 100 prototype, demonstrating the center frequency and the frequency mismatch at the n=2 and n=3 modes. The FE predictions were compared with measurements of the fabricated dual-shell structure 100 prototype. The final mesh of the glassblowing simulation was exported to a CAD software, the substrate region was trimmed, and the 3D dual-shell geometry was reconstructed for the modal analysis. A comparison between measurements and predictions are summarized in Table 1.

TABLE 1

COMPARISON OF FE PREDICTION AND MEASUREMENTS ON THE FABRICATED DUAL-SHELL PROTOTYPE.

| Parameter | FE Simulation | Measurement |
|---|---|---|
| Rim thickness (um) | 86.2 | 86.2 |
| Stem radius (mm) | 0.32 | 0.48 |
| Inner shell radius (mm) | 3.33 | 3.24 |
| Outer shell radius (mm) | 4.06 | 3.9 |
| Total dual-shell height (mm) | 2.57 | 2.67 |
| Resonant frequency (kHz) | 8.7 | 9.6 |

Table 1 illustrates frequency response according to one or more embodiments, including initial frequency response characterization of an exemplary embodiment of a dual-shell prototype using a bulk piezo stack excitation and LDV for detection, wherein no coupling was observed between the inner and outer shell. Table 1 provides a tabular comparison of FE prediction and measurements on the fabricated dual-shell prototype.

Table 2 illustrates including sample results of frequency, frequency mismatch, and Q-factor. Table includes sample results of frequency, frequency mismatch, and Q-factor at the n=2 and n=3 modes.

TABLE 2

| | n = 2 mode | | | n = 3 mode | | |
|---|---|---|---|---|---|---|
| Prototype | f (kHz) | df (Hz) | Q-factor | f (kHz) | df (Hz) | Q-factor |
| #A1 | 9.671 | 47.9 | 262,530 | 23.263 | 68.8 | 1,321,700 |
| #B1 | 4.905 | 26.5 | 945,607 | 14.581 | 4.4 | 1,169,392 |
| #B2 | 5.499 | 65.1 | 1,129,969 | 16.223 | 87.6 | 1,237,700 |
| #B3 | 4.782 | 30.9 | 721,161 | 13.953 | 12.7 | 797,887 |
| #C1 | 7.914 | 8.2 | 313,600 | 15.638 | 15.1 | 1,613,136 |
| #C2 | 5.456 | 65.7 | 1,252,811 | 15.836 | 61.6 | 1,533,332 |
| #C3 | 6.261 | 68.2 | 141,969 | 16.354 | 67 | 862,521 |
| #C4 | 6.958 | 30.7 | <50,000 | 19.306 | 45.1 | 1,540,475 |

Figure 14A:
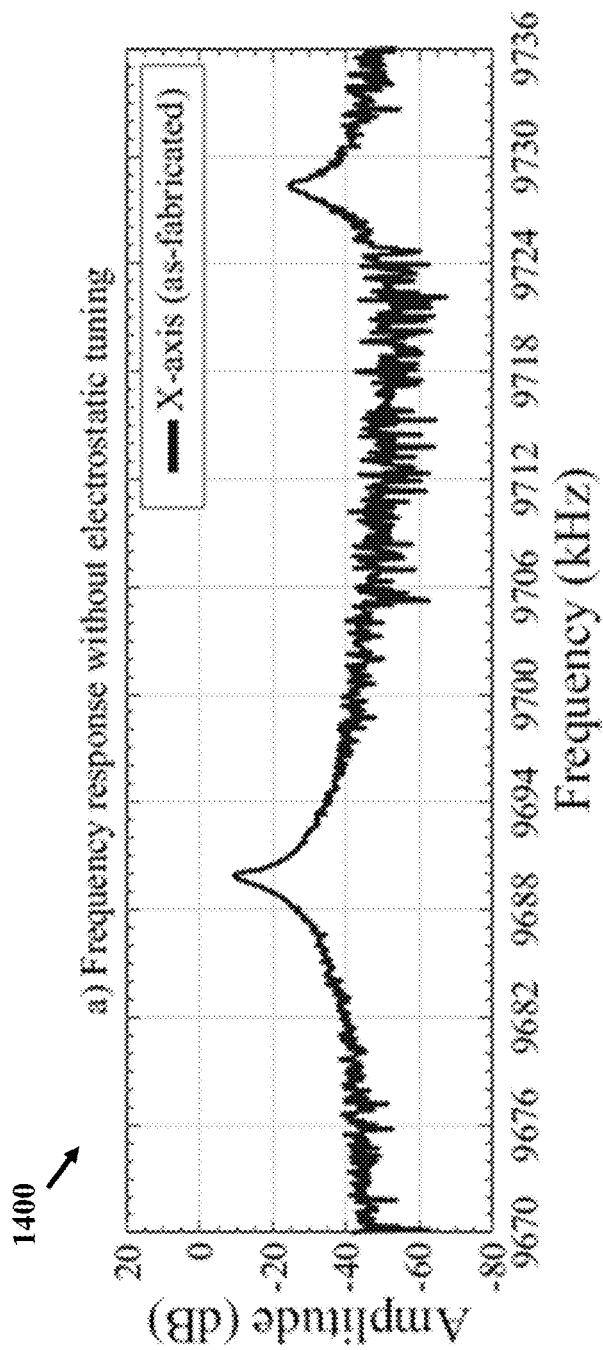
FIG. 14A illustrates a frequency response for a dual-shell resonator according to one or more embodiments.
Figure 14B:
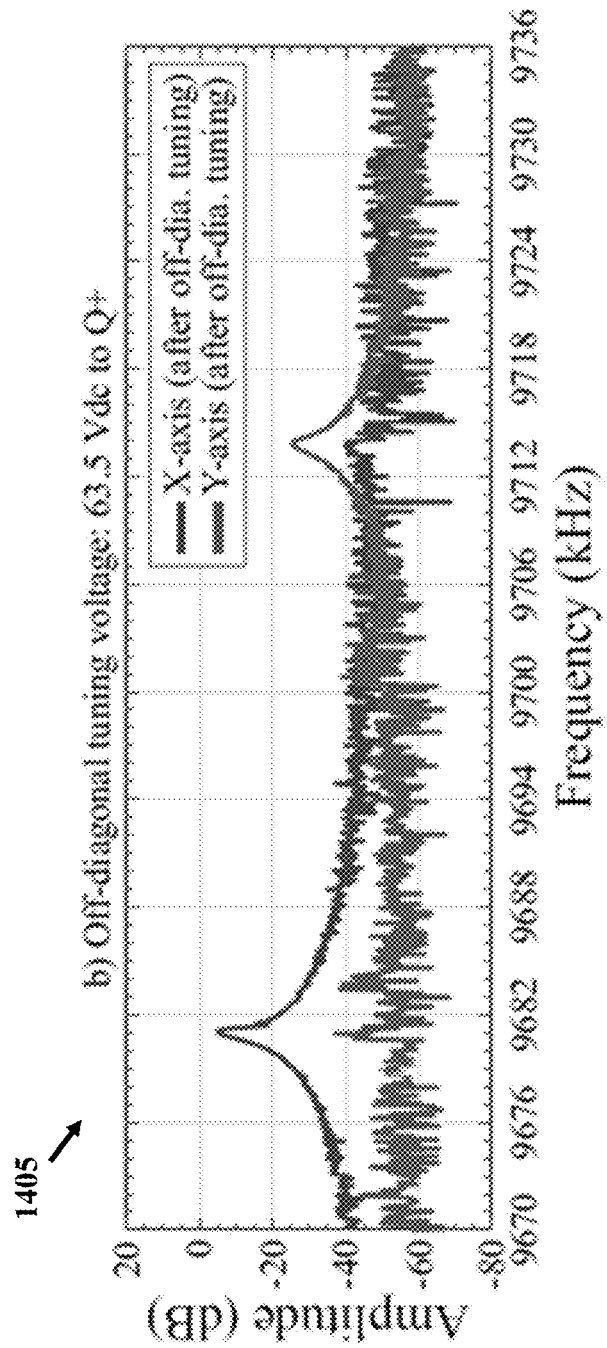
FIG. 14B illustrates off-diagonal electrostatic tuning for a dual-shell resonator according to one or more embodiments.
Figure 14C:
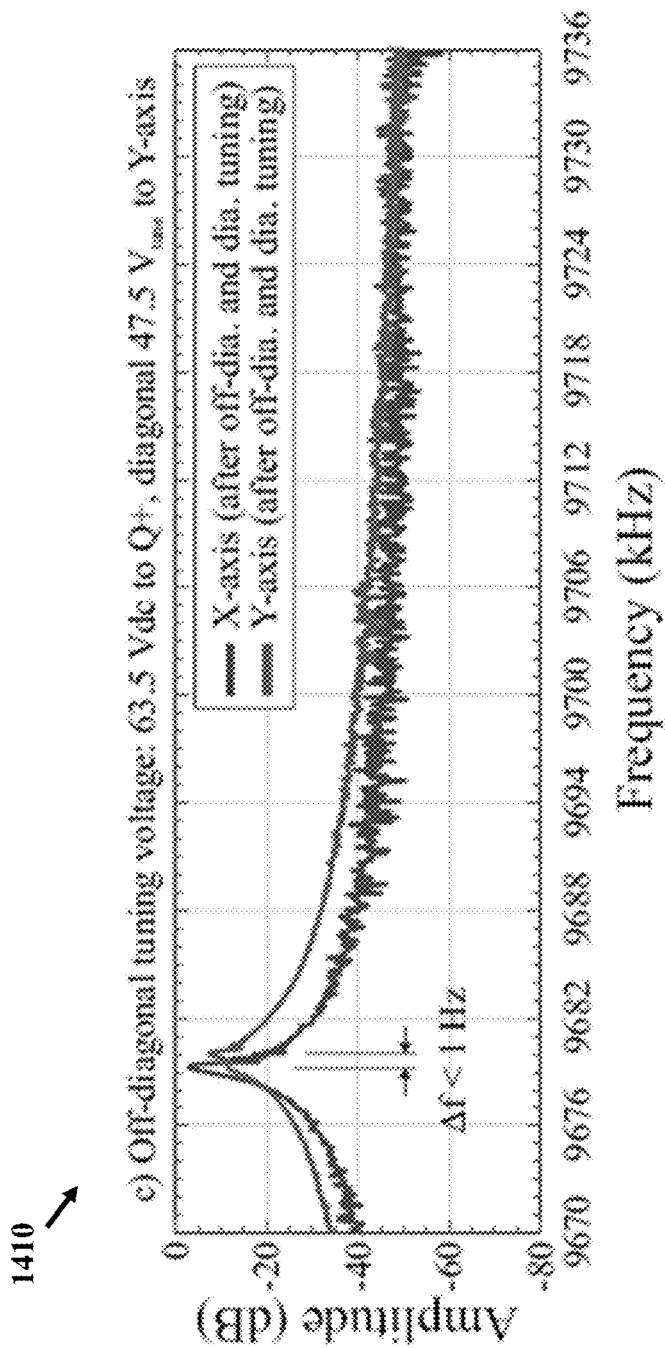
FIG. 14C illustrates frequency mismatch tuning for a dual-shell resonator according to one or more embodiments.

FIG. 14A is a graphic depiction of a sample electrostatic frequency sweep for a dual-shell resonator. Frequency response 1400 is shown for a resonator without electrostatic tuning. FIG. 14B is a graphic depiction of a sample off-diagonal electrostatic tuning for modal decoupling for a dual-shell resonator. Frequency response 1405 is shown for a resonator based on off-diagnol tuning. FIG. 14C is a graphic depiction of a sample diagonal electrostatic tuning for frequency mismatch tuning for a dual-shell resonator. Frequency response 1410 is shown for a resonator based on off-diagonal tuning.

Figure 15:
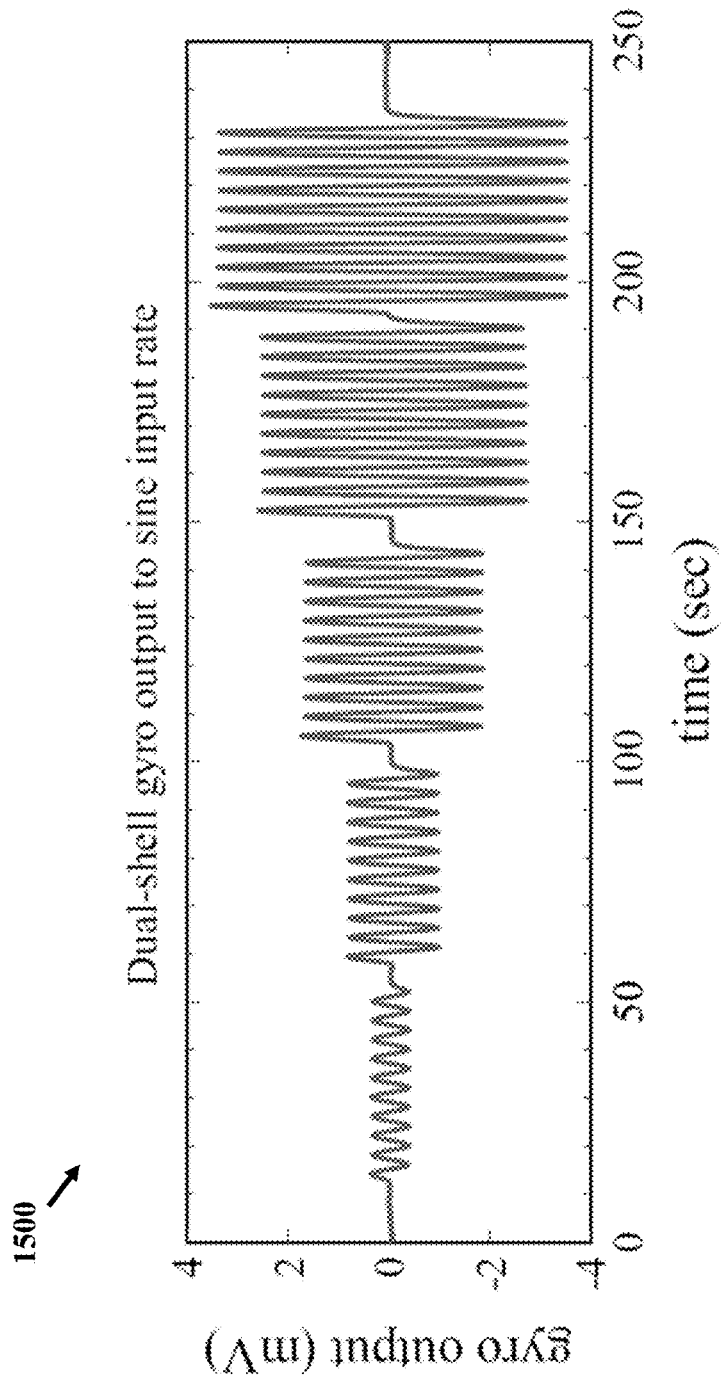
FIG. 15 illustrates a sample sensor output for a gyro configuration according to one or more embodiments.

FIG. 15 illustrates a sample sensor output for a gyro configuration according to one or more embodiments. Sample sensor output 1550 is shown for a resonator implemented as a gyro to sinusoidal rotation inputs for the dual-shell structure.

Figure 16A:
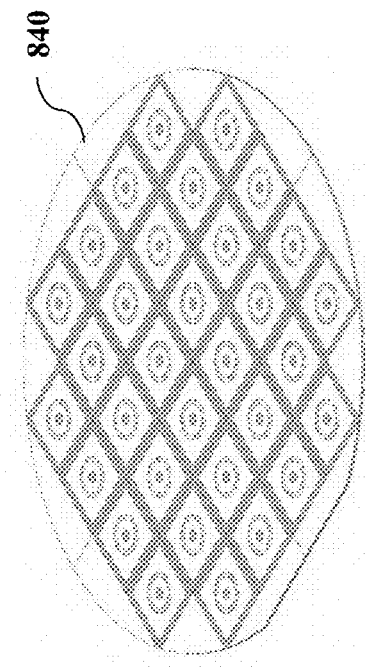
FIGS. 16A-16F dual-shell resonator wafer according to one or more embodiments.
Figure 16B:
Figure 16C:
Figure 16D:
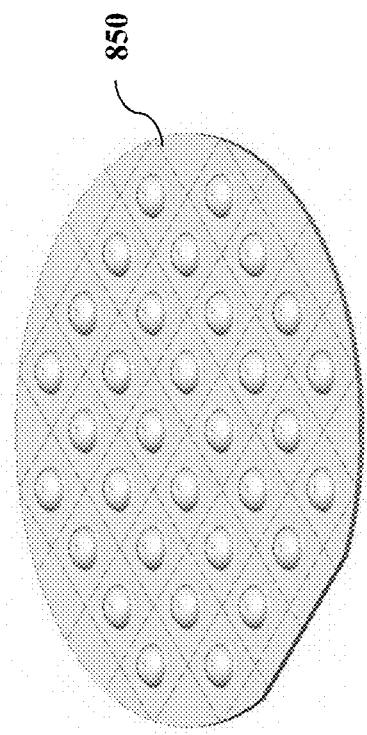
Figure 16E:
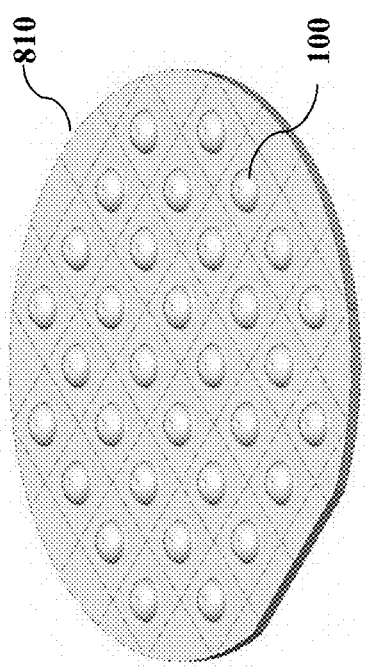
Figure 16F:
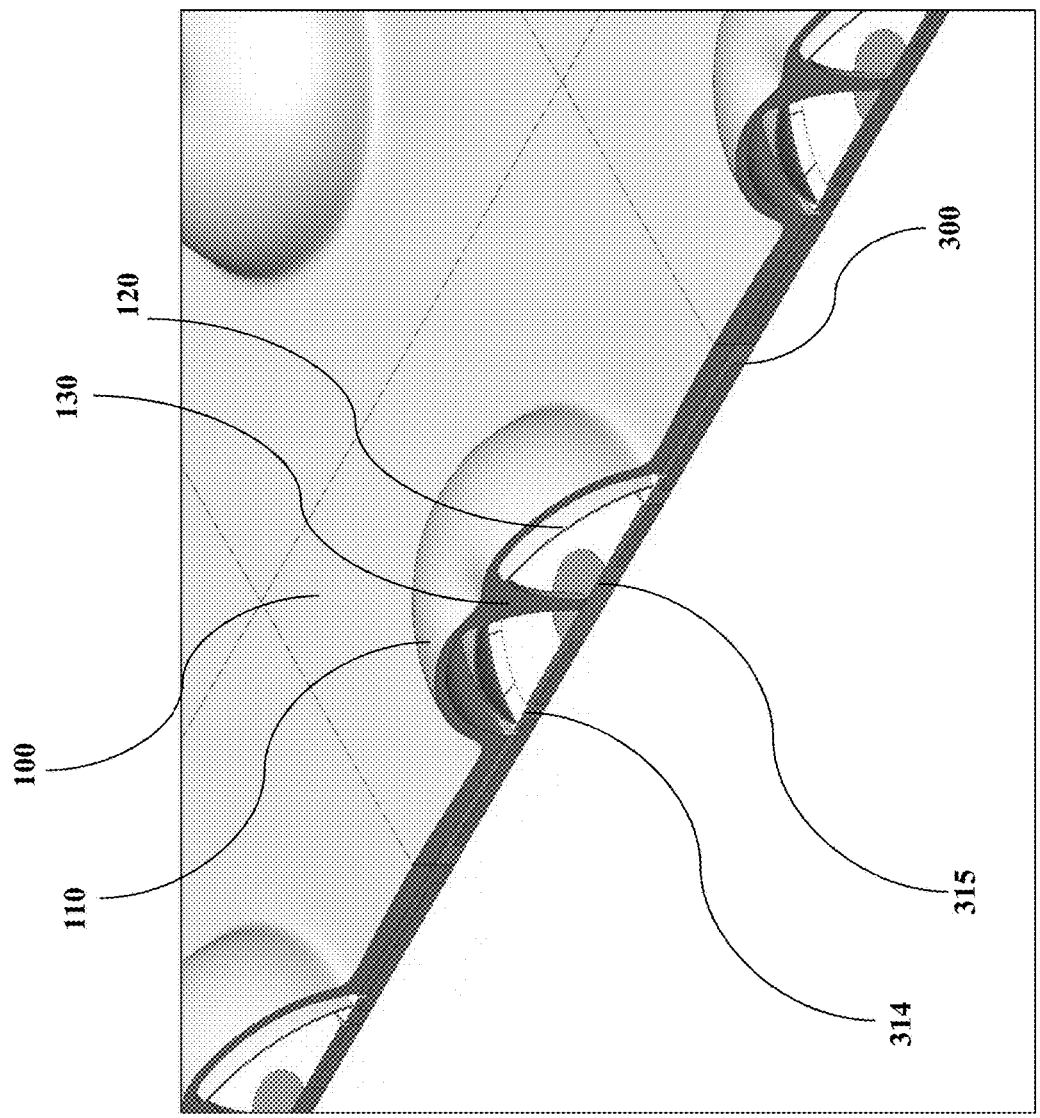

FIGS. 16A-16F illustrate a dual-shell resonator wafer according to one or more embodiments. FIG. 16A is an isometric view of a dual-shell structure wafer 810 including a plurality of dual-shell structures 100 manufactured on a wafer-scale. FIG. 16B is a side view of the dual-shell structure wafer 810 of FIG. 16A. FIG. 16C is a side view of a back-lapped dual-shell structure wafer 830, wherein back-lapping is performed on the dual-shell structure wafer 810 to remove the substrate and release the inner shells 120. FIG. 16D is an isometric view of an electrode substrate wafer 840 corresponding with the dual-shell structure wafer 830 of FIG. 16C. FIG. 16E is an isometric view of an assembled dual-shell resonator wafer 850 comprising the back-lapped dual-shell structure wafer 830 of FIG. 16C joined with the electrode substrate wafer 840 of FIG. 16D. FIG. 16F is a cutaway isometric view of a dual-shell resonator 100 in the plurality of dual-shell resonators 100 comprising the dual-shell resonator wafer 850 of FIG. 16E.

Piezo Actuation of Fused Quartz Dual Shell Resonator

Actuation of a resonator is to convert a signal (in most cases electric signal) into the motion of the resonator. For resonators made of electrically conductive material, such as silicon, the structure itself can be used as an electric path for the signal. On the other hand, for resonators made of insulator, such as fused quartz, metal coating is generally necessary so that the electric signal can be delivered to the structure. Fused quartz is one of the materials whose intrinsic internal energy loss is very low. Therefore, resonators made of fused quartz theoretically can achieve very high mechanical quality factor than traditional silicon resonators. The noise level of a resonator is inversely proportional to its mechanical quality factor. Therefore, a higher mechanical quality factor can lead to a lower noise level of a resonator, which is the goal of many applications.

However, it has been demonstrated that with metal coating as thin as 2 nm on the surface of fused quartz resonator, the mechanical quality factor of the resonator will be reduced by 5 times due to surface loss and mismatch of coefficient of thermal expansion between different materials: T. Nagourney, et al. "Effect of metal annealing on the Q-factor of metal-coated fused silica micro shell resonators." 2015 IEEE International Symposium on Inertial Sensors and Systems (ISISS), 2015. As a result, one or more of an improved actuation method and fabrication process is needed to preserve the designed high quality factor of the fused quartz dual shell resonator.

According to one or more embodiments, piezo material is deposited and shaped on the outer shell. Vibration of the outer shell can be transferred to the inner shell to actuate the resonant element. In this way, only the support of the resonator is coated with metal and piezo material, and the resonant part is kept intact. Therefore, the mechanical quality factor of the resonator due to actuation will not be reduced. One or more embodiments are directed to utilization of the piezo layer, structuring the piezo layer, and the corresponding actuation process. A base electrode and a piezo material layer may be deposited on the outer cap layer, and the top electrode may be patterned and selectively deposited by shadow mask to actuate the device.

By depositing piezo layer and electrodes on the outer shell, which serves as a support for the resonator, the surface of the inner shell, which is the resonant element, will be protected from metal coating. Therefore, a much higher mechanical quality factor of the resonator can be achieved. As a result, the noise level of the resonator will be much lower. Besides, the energy needed to actuate the resonator will be also lower due to the high quality factor.

Figure 17A:
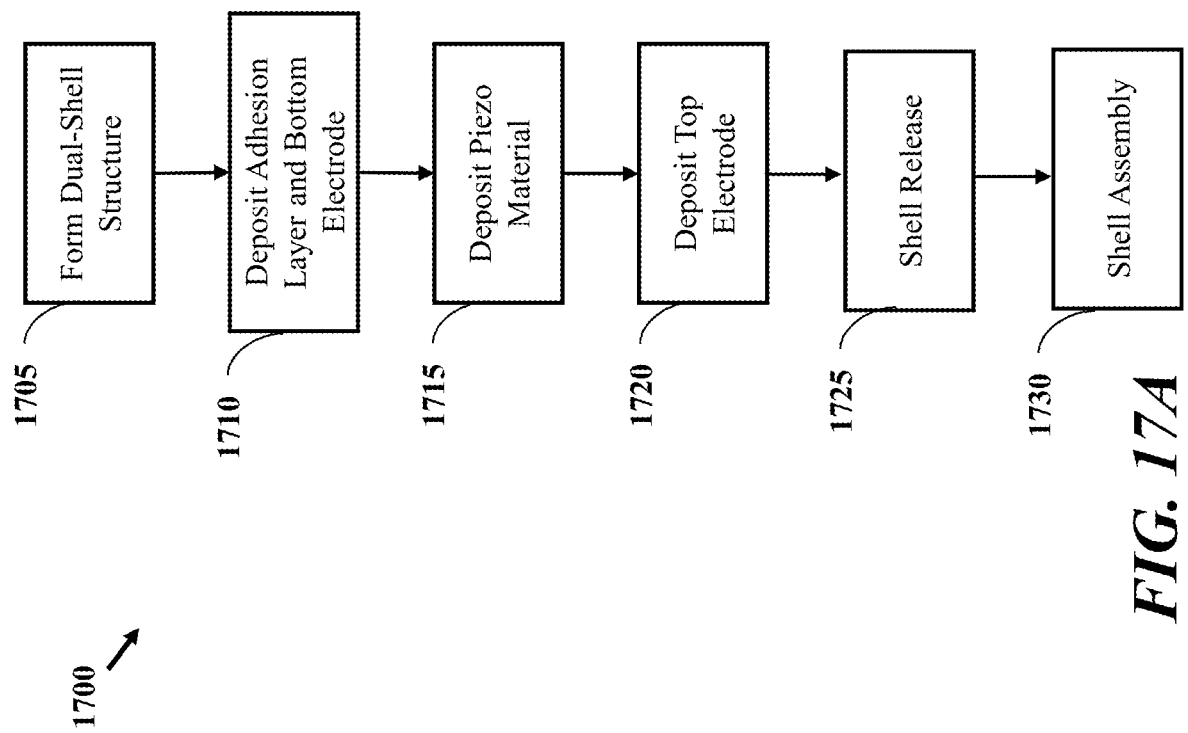
FIG. 17A illustrates a fabrication process according to one or more embodiments.

FIG. 17A illustrates a fabrication process according to one or more embodiments. According to one embodiment, process 1700 may be performed to form one or more dual shell structures and dual shell resonators (e.g., dual-shell structure 100, dual shell resonator 400, etc.). Process 1700 may be initiated by forming a dual-shell structure at block 1705. Formation of the dual-shell structure may include formation of an outer cap shell and inner device shell co-fabricated with a common stem. At block 1710, an adhesion layer and bottom electrode may be deposited for the dual-shell structure. At block 1715, piezo material may be deposited to the dual-shell structure. By way of example, an outer surface of the outer shell may be coated with a piezo material layer. At block 1720, a top electrode may be deposited. At block 1725, process 1700 includes releasing the shell. At block 1730, the shell may be assembled to a substrate.

Figure 17B:
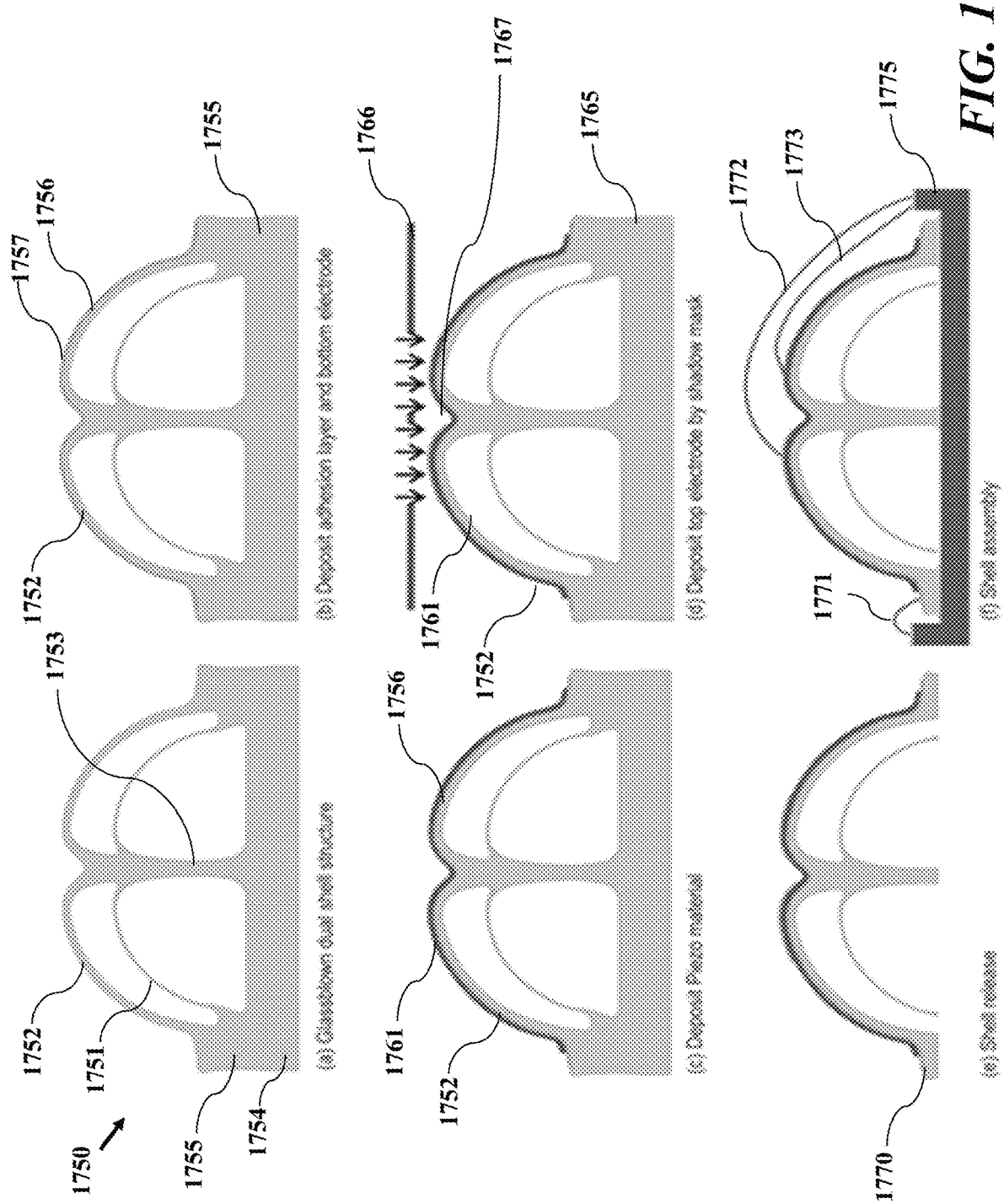
FIG. 17B shows a graphical representation of a fabrication process according to one or more embodiments.

FIG. 17B shows a graphical representation of a fabrication process according to one or more embodiments. In certain embodiments, process 1750 is a graphical representation of process 1700 of FIG. 17A. Process 1750 may be initiated based on a dual-shell structure 1755. According to one embodiment, dual-shell structure 1755 may be a glass-blown dual-shell structure. One or more of the processes and structures herein may employ the process of FIG. 17B.

Dual-shell structure 1755 may include an inner device shell 1751 and outer cap shell 1752 co-fabricated with common stem 1753. Dual-shell structure 1755 may also include substrate 1754. After dual-shell structure 1755 is fabricated by micro-glassblowing technique, the surface should be cleaned by standard RCA-1 solution or Piranha solution to remove any organic residue before subsequent deposition process. An adhesion layer 1756 and bottom electrode 1757 may be deposited to outer cap shell 1752. According to one embodiment, the deposition of may include titanium films sputter deposited on the surface and then annealed in Oxygen to form the Titanium dioxide layer as the adhesion layer 1756. Thickness of adhesion layer 1756 may be on the order of 200 nm. Then, a highly textured platinum layer can be sputter deposited on the adhesion layer 1756 as bottom electrode 1757. The thickness of Platinum layer can be on the order of 100 nm. In certain embodiments a shadow mask process is used to selectively deposit metal on curved surface. The shadow mask process may deposit one or more electrode configurations to an outer cap layer and/or one or more materials already on the outer cap layer including but not limited to metal, adhesion material, etc.

Piezo material 1761 may then be deposited to adhesion layer 1757 and bottom electrode 1757. A top electrode 1766 may then be deposited over piezo material 1761. Next, a 1 µm PZT layer with a Zr/Ti ratio of 52/48 can be deposited using a chemical solution deposition method with a crystallization temperature of 700° C. However, other piezo-electrical materials can be used for this purpose. The following step is for selective top electrode coating by shadow mask. The top electrode 1766 may be a 100 nm Platinum layer deposited by evaporation or sputtering. Finally, the resonator can be released shown by 1770 by lapping away the substrate and assembled to a ceramic package for further operation. A detailed process of piezo stack fabrication on flat surface has been reported, for example, in: D. M. Potrepka, et al. "Pt/TiO2 growth templates for enhanced PZT films and MEMS devices." MRS Online Proceedings Library Archive 1299 (2011). Traditionally on flat devices, the top electrode, the piezo layer, and the bottom electrode can be patterned by lift-off process or ion milling. This disclosure describes techniques configured for a curved surface of structures including use of a shadow mask method.

Following shell release, shell assembly may be performed including a plurality of connections of one or more electrode regions. Connection 1771 may relate to a connection of outer cap shell 1752 rim to substrate 1775. In addition, one or more electrodes may be coupled to top electrodes of outer cap shell 1752, such as electrodes 1772 and 1773. By way of example, dual-shell resonator may be configured to include a connection 1771 for the outer rim of the outer cap shell to a substrate, and a plurality of electrode connections 1772, 1773, and 177 coupled to electrode areas deposited on the outer cap shell.

Figure 18:
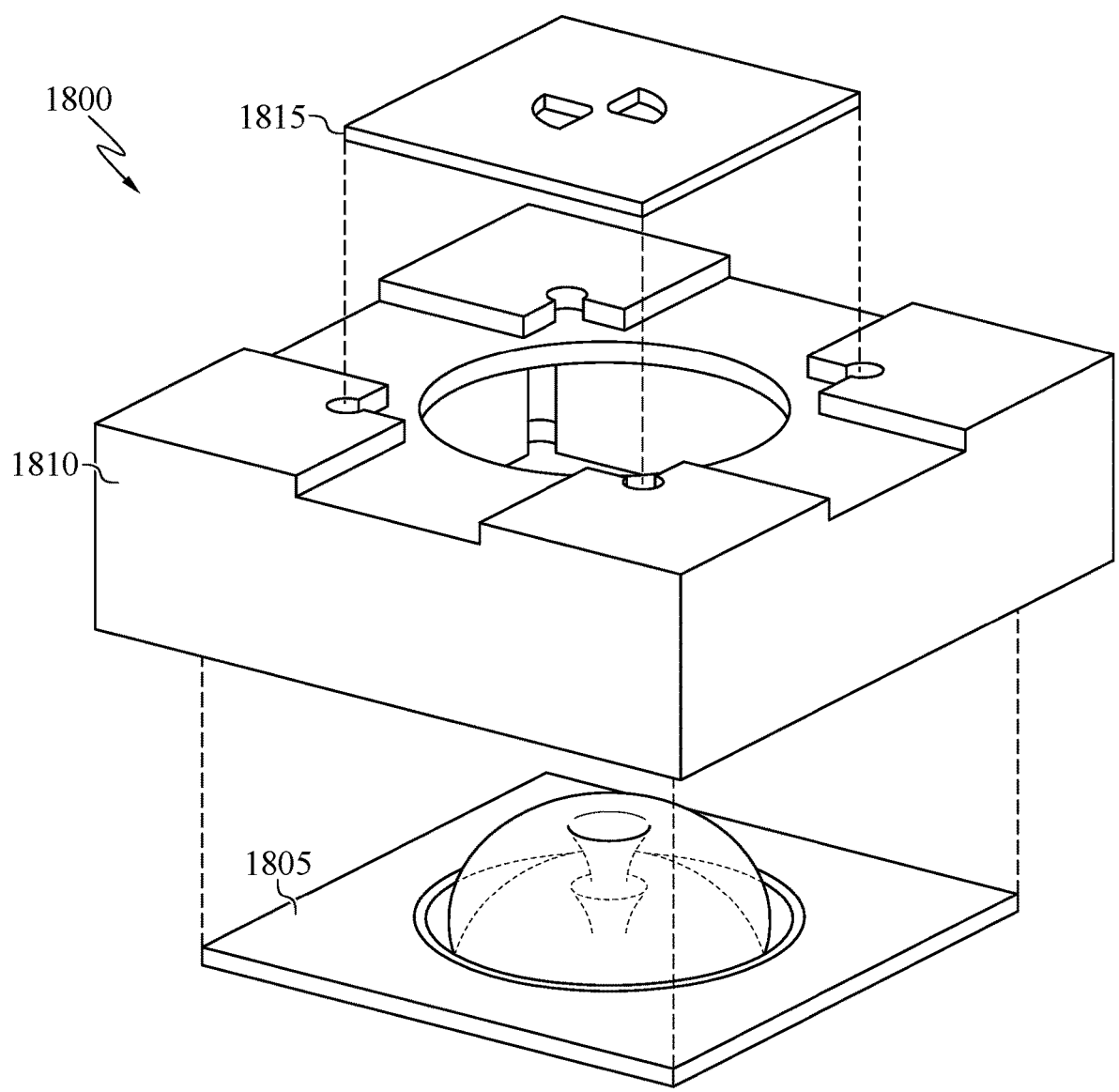
FIG. 18 shows a shadow mask method according to one or more embodiments.

FIG. 18 illustrates a shadow mask method according to one or more embodiments. According to one embodiment a shadow mask process 1800 may be employed for selective metal deposition on a dual shell structure 1805. FIG. 18 shows a dual-shell structure 1805, shadow mask 1815, and frame 1810. Frame 1810 may be used to align shadow mask 1815 with the structure to be deposited. Shadow mask 1815 can be batch-fabricated by deep reactive-ion etching (DRIE) of prime silicon wafer. Different shapes of opening can be designed to optimize the shape of the top electrode. In certain embodiments, frame 1810 can be machined, for example, from aluminum or graphite to withstand the high temperature during deposition and also eliminate out-gassing.

Figure 19B:
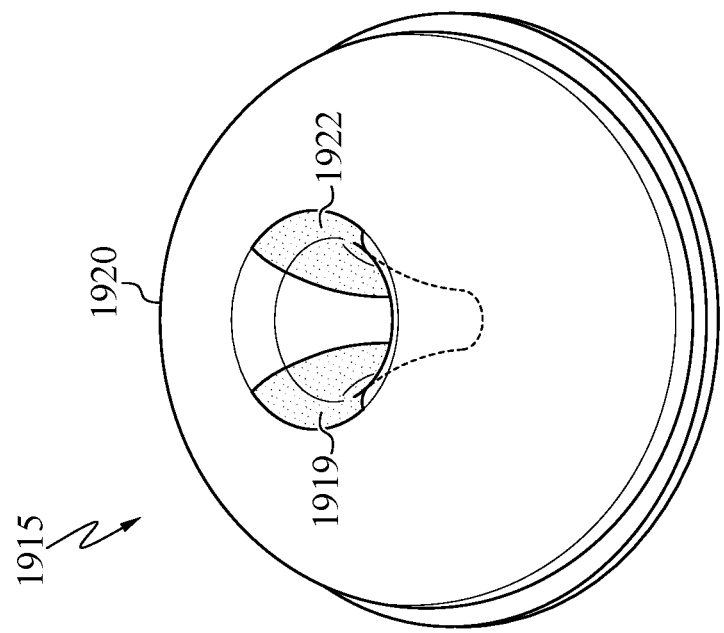
FIGS. 19A-19B illustrate dual-shell resonator structures with electrodes according to one or more embodiments.
Figure 19A:
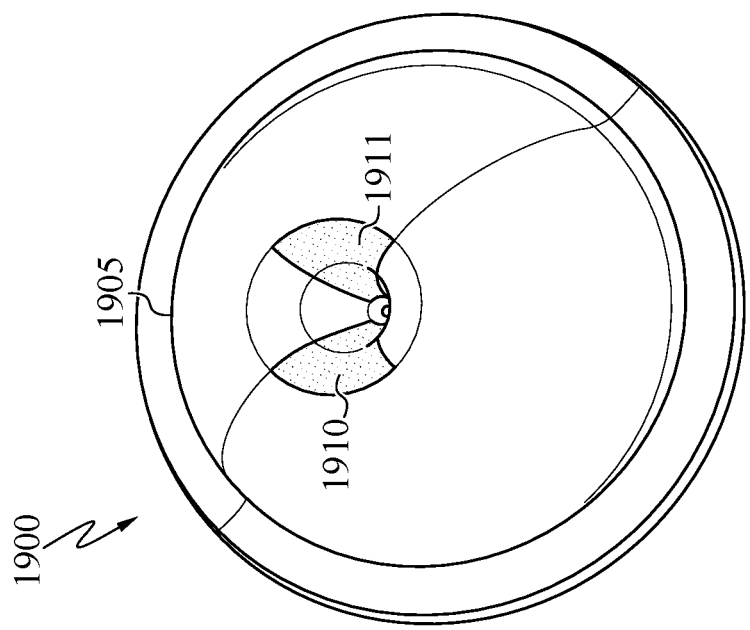

FIGS. 19A-19B illustrate dual-shell resonator structures with electrodes according to one or more embodiments. FIG. 19A illustrates dual-shell resonator structure 1900 including outer cap shell 1905 and electrodes 1910 and 1911. According to one embodiment, electrodes 1910 and 1911 may be deposited on outer cap shell 1905. According to another embodiment, electrodes 1910 and 19111 may be fabricated using a shadow mask process (e.g., shadow mask process 1800). According to one embodiment, a designed shape of top electrodes 1910 and 1911 may result in deposition areas. FIG. 19B shows a fabricated dual-shell resonator structure 1915 including outer cap shell 1920 and the deposition result including electrodes 1919 and 1922.

Figure 20:
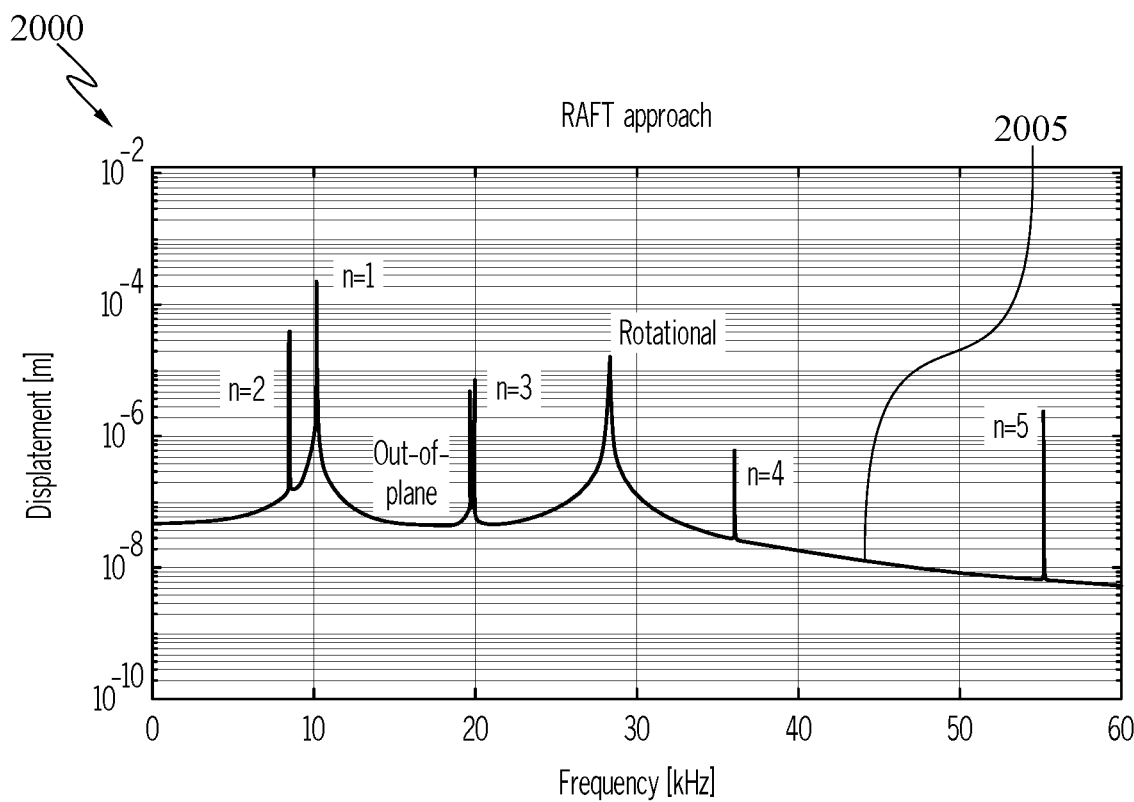
FIG. 20 illustrates a simulated response of a dual-shell resonator according to one or more embodiments.

FIG. 20 illustrates a simulated response of a dual-shell resonator according to one or more embodiments. Transduction of the vibration from the outer shell to the inner shell has been demonstrated numerically. A method called Rapid Analytical-FEA Technique (RAFT) is used to simulate the frequency response of the dual shell resonator. The details of the method are reported in: J. M. Puder, et al. "Rapid Harmonic Analysis of Piezoelectric MEMS Resonators." IEEE transactions on ultrasonics, ferroelectrics, and frequency control 65.6 (2018): 979-990. The general idea is first to apply the finite element analysis to analyze the information of different modes, such as resonant frequency, effective stiffness, and energy stored due to the piezoelectric effect, and then use the analytical model to combine the information of different modes to generate the frequency response of the resonator. It is worth noticing that in this model, the quality factor of each mode should be manually assigned to generate the frequency response. For the n=2 resonant mode, a conservative quality factor value of 1e5 was assumed for the demonstration. An AC driving voltage of 10V was assumed. For these parameters, the predicted maximum displacement of the resonator is on the order of 10 μm, which is large enough to be detected optically. The complete frequency response of the dual shell resonator is shown in the figure below. All the major modes (the first 5 modes) have been captured.

FIG. 20 illustrates a Rapid Analytical-FEA Technique (RAFT) response 2000 for a dual-shell resonator as described here. Displacement of the dual-sell resonator is shown by 2005 relative to frequency range. According to one embodiment, the n=2 mode of displacement is relates to an for electrode shape for driving effect. According to one embodiment, one or more of shape, position, and electrode configurations may be formed/fabricated base on displacement characteristics. In addition, shape of a top electrode may be controlled to optimized to increase transduction rate so that lower driving voltage is needed to achieve large resonant displacement. The optimization technique is reported in: J. S. Pulskamp, et al. "Electrode-shaping for the excitation and detection of permitted arbitrary modes in arbitrary geometries in piezoelectric resonators." IEEE transactions on ultrasonics, ferroelectrics, and frequency control 59.5 (2012): 1043-1060. According to one embodiment, a top electrode configuration may be deposited on the surface of the resonator where the signs of the principal stress are the same. By taking advantage of the same sign of the principal stress, both the e31 and e32 piezoelectric stress constants both excite or inhibit the mode, and as a result, the driving effect of the piezo layer will reach its maximum. According to one embodiment, an optimized electrode shape for n=2 mode of displacement 2005 is shown in the figure above.

Figure 21:
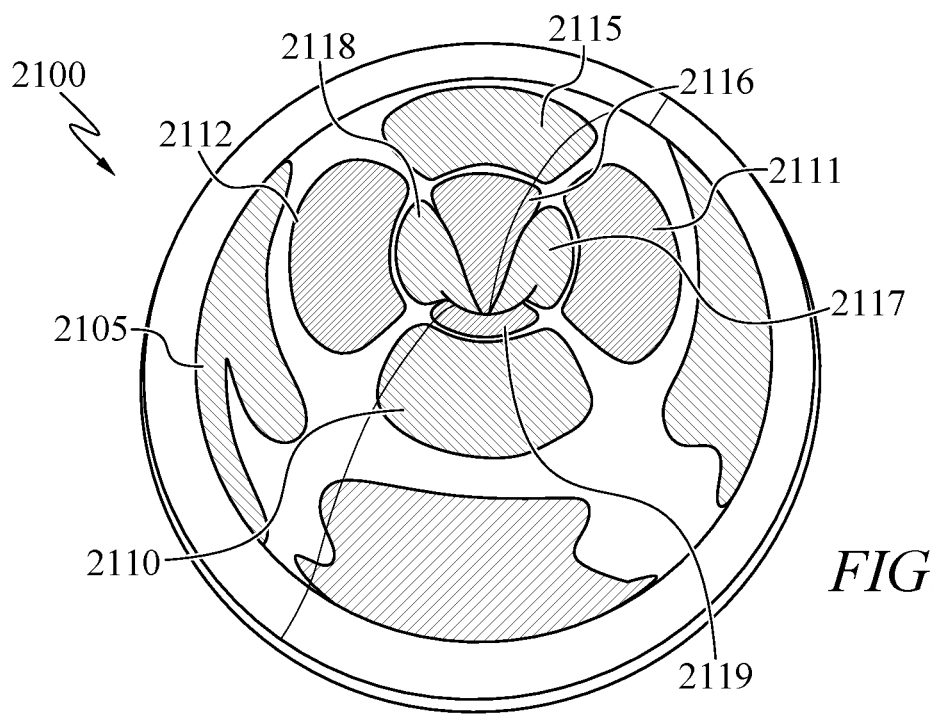
FIG. 21 illustrates dual-shell resonator electrode configurations according to one or more embodiments.

FIG. 21 illustrates dual-shell resonator electrode configurations according to one or more embodiments. Dual-shell resonator 2100 includes outer cap shell 2105 and one or more exemplary top electrode configurations. As discussed below, each electrode area may relate to the footprint or deposition area of electrode material on a shell resonator. According to one embodiment, a top electrode configuration includes electrode areas 2110 and 2115 on the doom or top portion and electrode areas 2117 and 2118 in a conical recess (e.g., blue electrode areas). In one embodiment, an electrode configuration can include a first set of electrodes are deposited on a dome portion of the outer cap shell associated with the first area and the second set of electrodes are deposited in a recess of the cap shell associated with the second area, the first area perpendicular to the second area. According to one embodiment, electrode areas 2110 and 2115 are on opposite sides of the conical deformation, each electrode area has the same size and occupies about a quarter of the top dome portion. Electrode areas 2110 and 2115 may relate to a top and bottom position, while electrode areas 2117 and 2118 relate to a right and left position of the conical recess. Alternatively, a top electrode configuration may include electrode areas 2111 and 2112, and 2116 and 2119 in a conical recess portion (e.g., red electrode areas). Electrode configurations can include electrode areas associated with the red area or blue area of FIG. 21. Blue electrode areas may have a similar location as red area electrodes, however, as shown in FIG. 21, blue area electrodes may have a different external form, such as a slightly narrower width with respect to dome electrodes. In the case of differential driving configuration, two sets of electrodes can be deposited on the red and blue area on the outer cap layer, respectively. According in one embodiment, a first set of electrodes is associated with electrode area 2110 and 2115 (e.g., first area or areas) and a second set of electrodes is associated with electrode areas 2117 and 2118 (e.g., second area or areas). By optimizing electrode shape, such as the coverage area, position and external form, vibrational transduction can increase.

Figure 22:
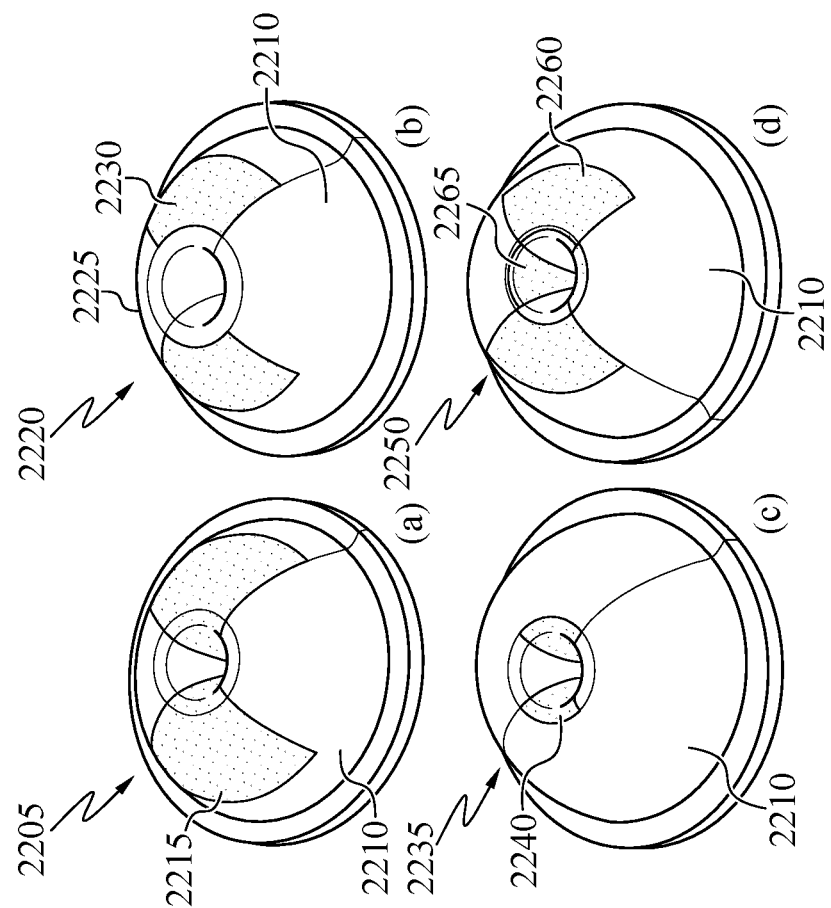
FIG. 22 illustrates dual-shell resonator electrode configurations according to one or more embodiments.

FIG. 22 illustrates dual-shell resonator electrode configurations according to one or more embodiments. According to one embodiment, one or more electrode configurations may be used for a dual-shell resonator.

Electrode configuration 2205 includes electrode a areas 2215 on the top dome portion of the shell 2210 extending down the dome portion and into a conical recess. Electrode configuration 2205 includes electrode areas on alternate sides (e.g., left and right) of shell 2210.

According to one embodiment, electrode configuration 2220 includes electrode areas 2230 on the top dome portion of the shell 2210 extending down the dome portion but not into a conical recess. Electrode areas 2230 do not extend ad low as electrodes areas 2215 in electrode configuration 2205.

According to one embodiment, electrode configuration 2235 includes electrode areas 2240 in the recess of shell 2210 and does not include electrode areas on the top dome portion. According to one embodiment, electrode configuration 2250 includes electrode areas 2265 on the top dome portion of the shell 2210 extending down the dome portion and electrode areas 2265 in the recess of shell 2210.

Figure 23:
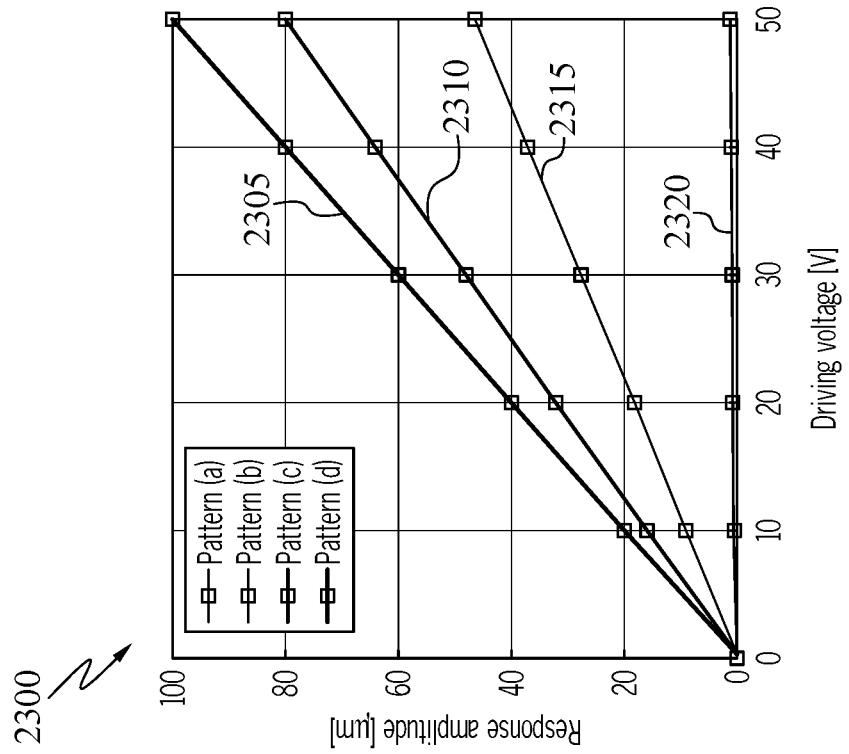
FIG. 23 illustrates response values of dual-shell resonator electrode configurations according to one or more embodiments.

FIG. 23 illustrates simulated response values of dual-shell resonator electrode configurations according to one or more embodiments. Response representations are shown charting response amplitude to driving voltage for a resonator structure. Response 2305 relates to an electrode configuration having electrode areas on a dome and in a recess of the cap dome in an alternate configuration, such as electrode configuration 2250 of FIG. 22. Response 2310 relates to an electrode configuration having electrode areas in a recess of the cap dome, such as electrode configuration 2235 of FIG. 22. Response 2315 relates to an electrode configuration having electrode areas on a dome on alternate sides, such as electrode configuration 2220 of FIG. 22. Response 2320 relates to an electrode configuration having electrode areas on a dome and in a recess of the cap dome, such as electrode configuration 2215 of FIG. 22.

[NOTE TO INVENTORS: elements in disclosure directed to Atomic Layer Deposition (ALD) to deposit piezo material on the outer shell have not been descried as indicated as under development, see 2020-334 disclosure page 7]

While this disclosure has been particularly shown and described with references to exemplary embodiments thereof, it will be understood by those skilled in the art that various changes in form and details may be made therein without departing from the scope of the claimed embodiments.

What is claimed is:

1. A dual-shell resonator comprising:
an outer cap shell having an outer rim; and
an inner device shell, wherein the outer cap shell and inner device shell are co-fabricated and share a common stem,
wherein the outer rim of the cap shell and a base of the common stem are each configured to be fixed to a substrate layer and to provide an anchor for the inner device shell,
wherein the inner device shell includes a portion configured to vibrate within the outer cap shell; and
wherein the outer cap shell, inner device shell and common stem are formed by triple stacked wafers with concentric cavities.

2. The dual-shell resonator of claim 1, wherein the outer cap shell is a hemispherical dome configured to house the inner device shell, and wherein the outer cap shell, inner device shell and stem are fused quartz.

3. The dual-shell resonator of claim 1, wherein the inner device shell is configured to operate using at least one of capacitive excitation and detection relative to the substrate layer.

4. The dual-shell resonator of claim 1, wherein the outer cap shell, the inner device shell and stem are co-fabricated by high-temperature glassblowing of the triple-stacked wafers, and wherein the common stem is a self-aligned stem.

5. The dual-shell resonator of claim 1, wherein a sensor is configured to measure vibrations of the inner device shell.

6. The dual-shell resonator of claim 1, wherein the outer cap shell includes a deposited piezo layer.

7. The dual-shell resonator of claim 1, wherein the outer cap layer includes at least one electrode configuration deposited by shadow mask.

8. The dual-shell resonator of claim 1, wherein the outer cap layer includes a differential driving configuration including at least a first set of electrode areas deposited on a first area and a second set of electrode areas deposited on a second area.

9. The dual-shell resonator of claim 8, wherein a first set of electrodes are deposited on a dome portion of the outer cap shell associated with the first area and the second set of electrodes are deposited in a recess of the cap shell associated with the second area, the first area perpendicular to the second area.

10. The dual-shell resonator of claim 1, wherein the dual shell resonator is configured to include a connection of the outer rim of the outer cap shell to a substrate, and a plurality of electrode connections coupled to electrode areas deposited on the outer cap shell.

11. A method for fabricating a dual-shell resonator structure, the method comprising:
pre-etching cavities on a cap wafer;
pre-etching cavities on a device wafer;
bonding the device wafer to a substrate wafer to form a substrate pair;
aligning and bonding the cap wafer to the substrate pair to form a wafer stack with aligned cavities including a cap cavity and a device cavity;
performing glassblowing of the wafer stack to form a dual-shell structure, wherein the dual shell structure includes:
an outer cap shell having an outer rim; and an inner device shell, wherein the outer cap shell and inner device shell are co-fabricated and share a common stem, wherein the outer rim of the cap shell and a base of the inner stem are each configured to be fixed to a substrate layer and to provide an anchor for the inner device shell, wherein the inner device shell includes a portion configured to vibrate within the outer cap shell.

12. The method of claim 11, wherein pre-etching cavities on the device wafer and cap wafer includes pre-etching fused quartz wafers by isotropic wet etching using Hydrofluoric (HF) acid.

13. The method of claim 11, wherein the device wafer is bonded to the substrate wafer and the cap wafer is aligned and bonded to the substrate pair by plasma-assisted wafer bonding.

14. The method of claim 11, wherein the outer cap shell is a hemispherical dome configured to house the inner device shell, and wherein the outer cap shell, inner device shell and stem are fused quartz.

15. The method of claim 11, further comprising coating an outer surface of the outer cap shell with a piezo material layer.

16. The method of claim 11, further comprising applying a thin-film metal conductive coating to an inner surface of the inner device shell and common stem.

17. The method of claim 11, further comprising applying a thin-film metal bonding coating to a section of the outer cap shell rim.

18. The method of claim 11, further comprising depositing a differential driving configuration on the outer cap layer, the differential driving configuration including at least a first set of electrode areas deposited on a first area and a second set of electrode areas deposited on a second area.

19. The method of claim 11, further comprising releasing an inner device shell by removing the substrate layer for integration of dual-shell resonator with a flat substrate for electrostatic actuation and detection.

20. The method of claim 11, further comprising boding the outer cap shell and common stem to a flat substrate by at least one of eutectic bonding, metal-metal compression bonding, and a low-outgassing conductive adhesives bonding, wherein a capacitive gap is provided between the inner device shell and the flat substrate.

\* \* \* \* \*